(12) United States Patent
Park et al.

(10) Patent No.: US 10,804,338 B2
(45) Date of Patent: Oct. 13, 2020

(54) DISPLAY DEVICE HAVING A PORTION OF A SUB LAYER THAT DOES NOT OVERLAP WITH SIGNAL LINES

(71) Applicant: Samsung Display Co., Ltd., Yongin-si (KR)

(72) Inventors: Yong-hwan Park, Cheonan-si (KR); Miyoung Kim, Daegu (KR); Jongseok Kim, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/516,772

(22) Filed: Jul. 19, 2019

(65) Prior Publication Data
US 2019/0348475 A1    Nov. 14, 2019

Related U.S. Application Data

(63) Continuation of application No. 15/659,561, filed on Jul. 25, 2017, now Pat. No. 10,361,254.

(30) Foreign Application Priority Data

Jul. 29, 2016    (KR) .......................... 10-2016-0097477

(51) Int. Cl.
*H01L 27/32*    (2006.01)
*H01L 51/00*    (2006.01)
(Continued)

(52) U.S. Cl.
CPC .......... *H01L 27/323* (2013.01); *G06F 1/1652* (2013.01); *G06F 3/044* (2013.01);
(Continued)

(58) Field of Classification Search
CPC ......... G06F 1/1652; G06F 2203/04103; G06F 2203/04112
See application file for complete search history.

(56) References Cited

U.S. PATENT DOCUMENTS 9,105,633 B2    8/2015  Yang
9,947,898 B2 *  4/2018  Kim .................... H01L 51/5246
(Continued)

FOREIGN PATENT DOCUMENTS

EP         3001479        3/2016
KR    10-2014-0016549    2/2014
(Continued)

OTHER PUBLICATIONS

Notice of Allowance dated Dec. 27, 2018 issued in Korean Patent Application No. 10-2016-0097477.
(Continued)

*Primary Examiner* — Chun-Nan Lin
(74) *Attorney, Agent, or Firm* — H.C. Park & Associates, PLC

(57) ABSTRACT

A display device including a substrate having a display area and a peripheral area defined outside the display area, a circuit layer disposed on the substrate, a device layer disposed on the display area, an encapsulation layer covering the device layer, a touch sensing unit including at least one touch insulating layer disposed on the encapsulation layer, touch electrodes disposed on the encapsulation layer, and touch signal lines connected to the touch electrodes, a first section disposed in the peripheral area and including a first part having a first thickness, a second part having a second thickness less than the first thickness and overlapping the touch signal lines, and an intermediate part connecting the first part and the second part and being inclined, and a first thickening pattern overlapping at least the intermediate part.

13 Claims, 28 Drawing Sheets

(51) Int. Cl.
*H01L 51/10* (2006.01)
*G06F 1/16* (2006.01)
*G06F 3/041* (2006.01)
*G06F 3/044* (2006.01)
*H01L 27/12* (2006.01)
*H01L 51/52* (2006.01)

(52) U.S. Cl.
CPC .......... *G06F 3/0412* (2013.01); *G06F 3/0416* (2013.01); *H01L 51/0023* (2013.01); *H01L 51/107* (2013.01); *G06F 2203/04103* (2013.01); *G06F 2203/04112* (2013.01); *H01L 27/12* (2013.01); *H01L 27/3246* (2013.01); *H01L 27/3258* (2013.01); *H01L 27/3269* (2013.01); *H01L 51/5256* (2013.01)

(56) References Cited

U.S. PATENT DOCUMENTS

| | | | |
|---|---|---|---|
| 10,050,228 B2* | 8/2018 | Zhang | H01L 51/5256 |
| 2008/0129898 A1 | 6/2008 | Moon | |
| 2010/0110041 A1* | 5/2010 | Jang | G06F 3/0412 |
| | | | 345/174 |
| 2014/0183470 A1 | 7/2014 | Kim | |
| 2015/0060806 A1* | 3/2015 | Park | H01L 51/5253 |
| | | | 257/40 |
| 2015/0160778 A1* | 6/2015 | Kim | G06F 3/044 |
| | | | 345/174 |
| 2015/0194628 A1 | 7/2015 | Kwak et al. | |
| 2016/0103537 A1* | 4/2016 | Park | G06F 3/0412 |
| | | | 345/174 |
| 2016/0154499 A1* | 6/2016 | Bae | G06F 3/044 |
| | | | 345/174 |
| 2016/0218151 A1* | 7/2016 | Kwon | H01L 27/323 |
| 2016/0246398 A1* | 8/2016 | Huang | G06F 3/044 |
| 2016/0246399 A1* | 8/2016 | Huang | G06F 3/044 |
| 2017/0125734 A1 | 5/2017 | Lee et al. | |

FOREIGN PATENT DOCUMENTS

| | | |
|---|---|---|
| KR | 10-2014-0086270 | 7/2014 |
| KR | 10-2015-0025994 | 3/2015 |
| KR | 10-2016-0028817 | 3/2016 |
| KR | 10-2016-0054822 | 5/2016 |
| KR | 10-2017-0049146 | 5/2017 |

OTHER PUBLICATIONS

European Search Report dated Jan. 4, 2018, in European Patent Application No. 17183185.2.
Non-Final Office Action dated Nov. 30, 2018, in U.S. Appl. No. 15/659,561.
Notice of Allowance dated Mar. 12, 2019, in U.S. Appl. No. 15/659,561.
Extended European Search Report dated Mar. 9, 2018, issued in European Application No. 17183185.2.

* cited by examiner

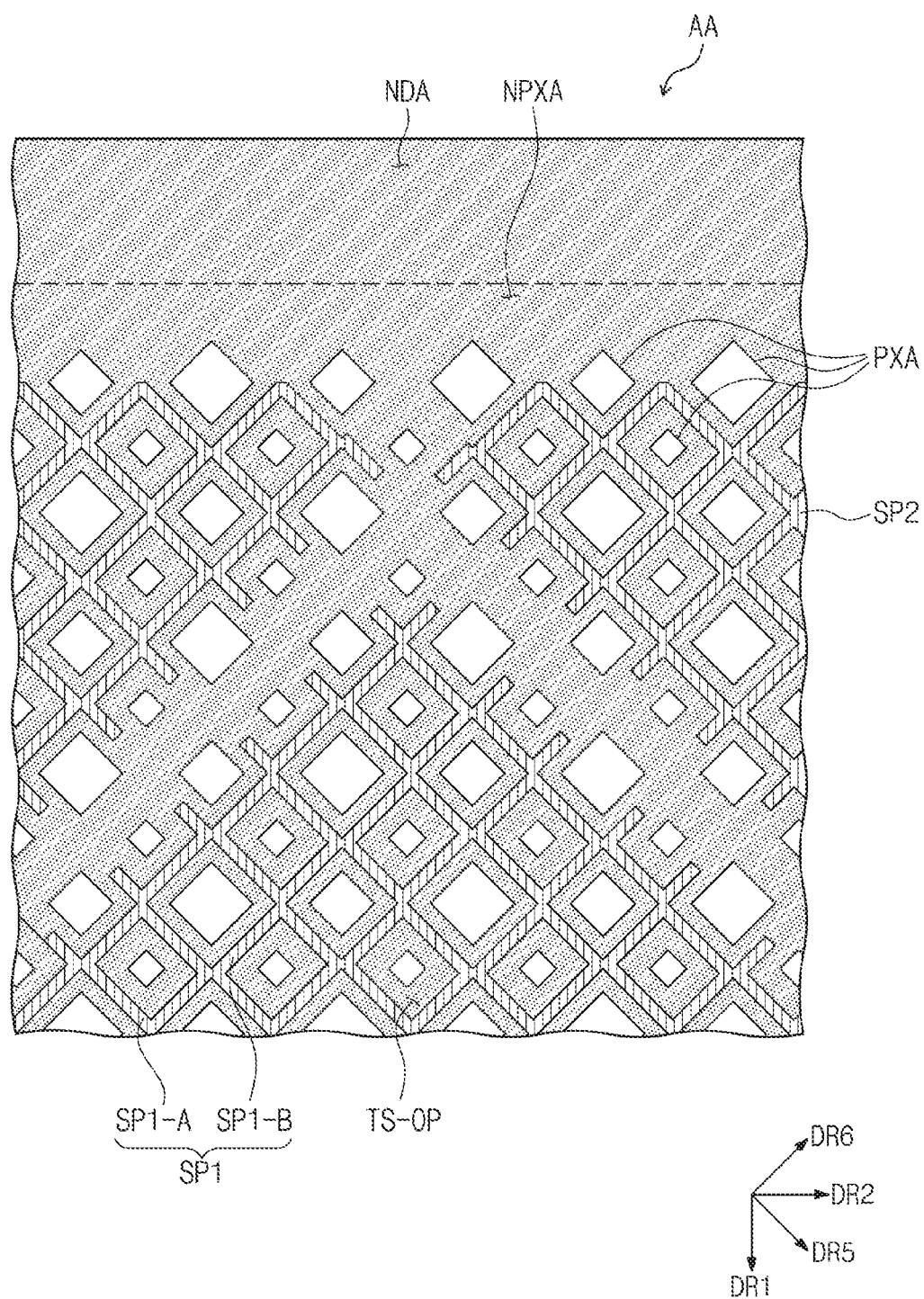

DISPLAY DEVICE HAVING A PORTION OF A SUB LAYER THAT DOES NOT OVERLAP WITH SIGNAL LINES

CROSS-REFERENCE TO RELATED APPLICATION

This application is a Continuation of U.S. patent application Ser. No. 15/659,561, filed Jul. 25, 2017, which claims priority from and the benefit of Korean Patent Application No. 10-2016-0097477, filed on Jul. 29, 2016, each of which is hereby incorporated by reference for all purposes as if fully set forth herein.

BACKGROUND

Field

The invention relates generally to a display device and a method of manufacturing the same, and, more particularly, to a display device and method of manufacturing the same that reduces or eliminates the possibility of certain defects occurring in the patterning process of one or more touch lines in the display device.

Discussion of the Background

Various display devices for a multimedia device, such as a television set, a mobile phone, a tablet computer, a navigation unit, a game unit, and so on, have been developed. As an input device for the display devices, a keyboard or a mouse is widely used. In recent years, a touch sensing unit is used as the input device of the display devices, which often use LEDs or OLED's as the light source for the pixels. Manufacture of such display devices is a complicated process requiring deposition of multiple layers of sensitive material and photoresist with tight tolerances. Incorporation of touch sensing lines for touch units has further complicated the process.

To create the requisite structural components in such devices, layers are often required to be deposited along inclined surfaces, which could result in uneven or non-uniform layer thickness. One of the problems that can result from deposition of non-uniform layers in OLEDs is delamination of layers due to leakage of organic material along the inclined surfaces during the etching process for forming the touch lines in the display device.

The above information disclosed in this Background section is only for enhancement of understanding of the background of the inventive concept, and, therefore, it may contain information that does not form the prior art that is already known in this country to a person of ordinary skill in the art.

SUMMARY

One or more embodiments of the invention provide a display device, and a method of manufacturing the same, that reduces or eliminates the possibility of certain defects occurring in a patterning process of a touch line or touch lines in the display device. In particular, one or more embodiments of the invention provide a display device and method of manufacturing the same that reduces or eliminates the possibility of layers becoming delaminated due to leakage of organic material along an inclined surface during an etching process for forming the touch lines in the display device. Applicants have discovered that leakage may occur due to insufficient thickness of the photoresist in the inclined portions and placing a cap on the inclined surface may reduce or eliminate the leakage and subsequent delamination. Moreover, processes of the invention may form a bank that reduces or prevents abnormal patterning of the touch signal lines, such as cuts or scratches due to a mask used to form the thin film encapsulation layer TFE in the OLED.

Additional aspects will be set forth in the detailed description which follows, and, in part, will be apparent from the disclosure, or may be learned by practice of the inventive concept.

According to one aspect of the invention, a display device includes a substrate having a display area and a peripheral area defined outside the display area, a circuit layer disposed on the substrate, a device layer disposed on the display area, an encapsulation layer covering the device layer, a touch sensing unit including at least one touch insulating layer disposed on the encapsulation layer, touch electrodes disposed on the encapsulation layer, and touch signal lines connected to the touch electrodes, a first section disposed in the peripheral area and including a first part having a first thickness, a second part having a second thickness less than the first thickness and overlapping the touch signal lines, and an intermediate part connecting the first and second parts and being inclined, and a first thickening pattern overlapping at least the intermediate part. The first thickening pattern may be further overlapped with the first part. The at least one touch insulating layer may include a lower insulating layer directly disposed on the encapsulation layer, an intermediate insulating layer disposed on the lower insulating layer, and an upper insulating layer disposed on the intermediate insulating layer, and the touch signal lines and the first thickening pattern may be disposed between the intermediate insulating layer and the upper insulating layer and covered by the upper insulating layer. The touch electrodes may include first touch electrodes including first sensor electrodes arranged in one direction and first connection electrodes connecting the first sensor electrodes and second touch electrodes including second sensor electrodes arranged in a direction substantially orthogonal to the one direction and second connection electrodes connecting the second sensor electrodes, the first connection electrodes may be disposed between the lower insulating layer and the intermediate insulating layer, and the first sensor electrodes, the second connection electrodes, and the second sensor electrodes may be disposed between the intermediate insulating layer and the upper insulating layer.

The display device may further include dummy lines disposed between the lower insulating layer and the intermediate insulating layer and each of the dummy lines may be overlapped with each of the touch signal lines, and each of the dummy lines is connected to a touch signal line overlapped with each of the dummy lines among the touch signal lines through a contact hole defined through the intermediate insulating layer.

The display device may further include a second thickening pattern overlapped with at least the intermediate part, and the second thickening pattern may be disposed between the lower insulating layer and the intermediate insulating layer.

The circuit layer may include a plurality of signal lines connected to the device layer and a plurality of pads connected to the signal lines and disposed at one side of the peripheral area, and the first section may be disposed between the display area and the pads.

The circuit layer may include a transistor and an insulating layer covering the transistor, and the second bank part is disposed on the same layer as the insulating layer of the circuit layer.

The device layer may include a light emitting diode emitting a light through an overlapping light emitting area and an insulating layer disposed on the insulating layer of the circuit layer overlapping a non-light emitting area, and the first bank part includes a lower part disposed on a same layer as the insulating layer of the circuit layer and an upper part disposed on the lower part and disposed on a same layer as the insulating layer of the device layer.

The lower part of the first part may be integrally provided with the second part.

The intermediate part may include a lower part disposed on the same layer as the insulating layer of the circuit layer and an upper part disposed on the lower part and disposed on the same layer as the insulating layer of the device layer, the upper part of the intermediate part is integrally provided with the upper part of the first part, and the lower part of the intermediate part is integrally provided with the lower part of the first part and the second part.

The display device may further include a dam disposed on the substrate between the first section and the display area, and the dam includes a lower part disposed on a same layer as the insulating layer of the circuit layer.

The dam may further include an upper part disposed on the lower part and disposed on the same layer as the insulating layer of the device layer.

The dam may have a height equal to or smaller than a height of the first part.

The touch signal lines and the first thickening patterns may include the same metal material.

The first section may include a bank; the first and second parts may include first and second bank parts; the intermediate part may include a boundary part; and, the first thickening pattern may include a first capping pattern.

According to another aspect of the invention, a method of manufacturing a display device includes providing a substrate including a display area and a peripheral area defined outside the display area, forming a circuit layer on the substrate, forming a device layer on the display area, forming a first layer on the peripheral area, the first layer extending in a first direction, the first layer including a first part having a first thickness, a second part having a second thickness less than the first thickness, and an intermediate part connecting the first part and the second part and being inclined relative thereto, forming an encapsulation layer covering the device layer, forming a touch sensing unit including a touch insulating layer disposed on the encapsulation layer, touch electrodes disposed on the encapsulation layer, and touch signal lines connected to the touch electrodes, and forming a thickening pattern overlapping at least the intermediate part.

The step of forming the thickening pattern may further include forming the thickening pattern to overlap the first part.

The step of forming the touch sensing unit may include forming the touch insulating layer, forming the touch electrodes, and forming the touch signal lines in the same process step as the step of forming the thickening pattern.

The step of forming the touch insulating layer may include forming a lower insulating layer on the encapsulation layer, forming an intermediate insulating layer on the lower insulating layer, and forming an upper insulating layer on the intermediate insulating layer, and the step of forming the thickening pattern may include forming the thickening pattern between the intermediate insulating layer and the upper insulating layer.

The step of forming the thickening pattern may include forming a conductive layer on the intermediate part and patterning the conductive layer.

According to the above, the thickening pattern is formed in the inclined intermediate part of the first section, and thus the leakage of the organic material in the first section during the etching process, leakage that is caused by the lack of thickness of the photoresist layer on the intermediate part, may be prevented from occurring. Consequently, a phenomenon in which layers are delaminated may be less likely to occur.

The foregoing general description and the following detailed description are exemplary and explanatory and are intended to provide further explanation of the claimed subject matter.

BRIEF DESCRIPTION OF THE DRAWINGS

The accompanying drawings, which are included to provide a further understanding of the inventive concepts, and are incorporated in and constitute a part of this specification, illustrate exemplary embodiments of the inventive concepts, and, together with the description, serve to explain principles of the inventive concepts.

FIG. 8F is an enlarged view of area AA of FIG. 8E;

DETAILED DESCRIPTION OF THE ILLUSTRATED EMBODIMENTS

Figure 1:
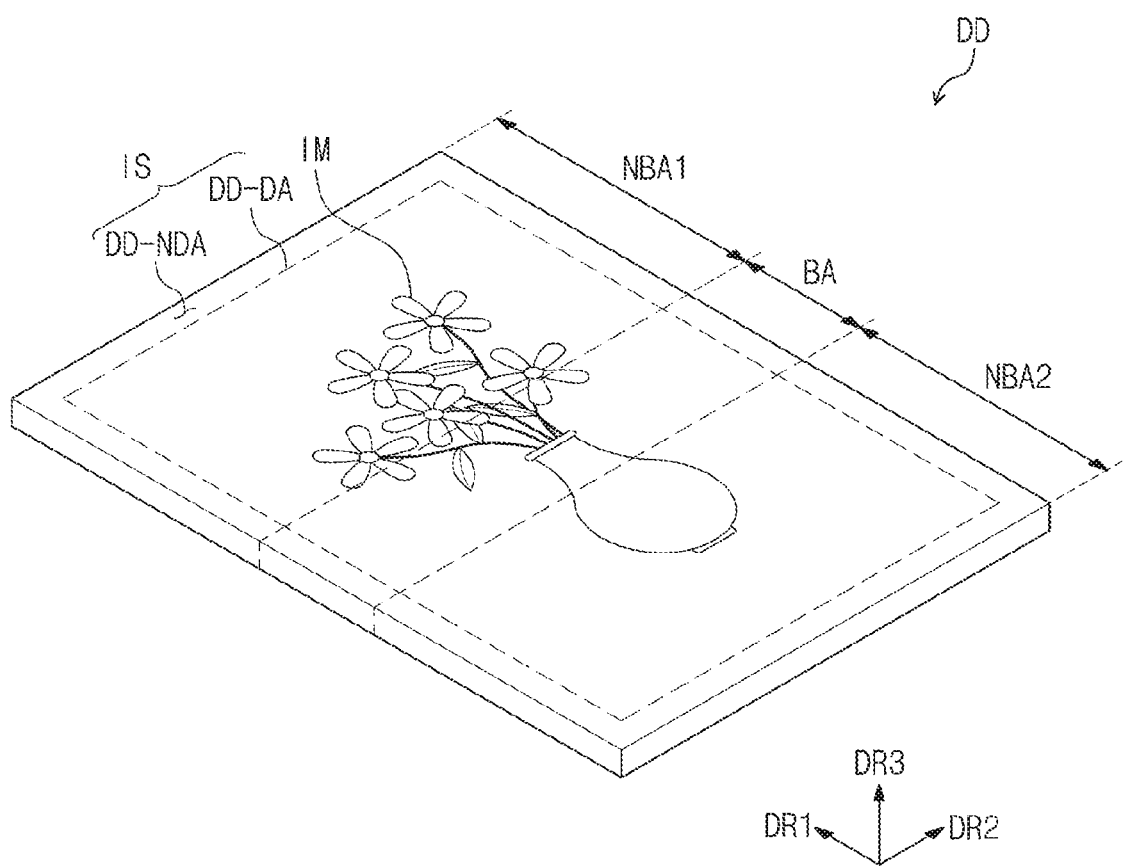
FIG. 1 is a perspective view of a first position of a first embodiment of a display device DD constructed according to the principles of the invention.

In the following description, for the purposes of explanation, numerous specific details are set forth in order to provide a thorough understanding of various exemplary embodiments. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments.

In the accompanying figures, the size and relative sizes of layers, films, panels, regions, etc., may be exaggerated for clarity and descriptive purposes. Also, like reference numerals denote like elements.

When an element or layer is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. Like numbers refer to like elements throughout. As used herein, the term "and/or" includes any and all combinations of one or more of the associated listed items.

Although the terms first, second, etc. may be used herein to describe various elements, components, regions, layers, and/or sections, these elements, components, regions, layers, and/or sections should not be limited by these terms. These terms are used to distinguish one element, component, region, layer, and/or section from another element, component, region, layer, and/or section. Thus, a first element, component, region, layer, and/or section discussed below could be termed a second element, component, region, layer, and/or section without departing from the teachings of the disclosure.

Spatially relative terms, such as "beneath," "below," "lower," "above," "upper," and the like, may be used herein for descriptive purposes, and, thereby, to describe one element or feature's relationship to another element(s) or feature(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof.

Various exemplary embodiments are described herein with reference to sectional illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not be construed as limited to the particular illustrated shapes of regions, but are to include deviations in shapes that result from, for instance, manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the drawings are schematic in nature and their shapes are not intended to illustrate the actual shape of a region of a device and are not intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and will not be interpreted in an idealized or overly formal sense, unless expressly so defined herein.

Referring to FIG. 1, a display surface IS, in which an image IM is displayed in a first operation state of the display device DD, is substantially parallel to a surface defined by a first direction axis DR1 and a second direction axis DR2. A normal line direction of the display surface IS, corresponding to a thickness direction of the display device DD, indicates a third direction DR3. In each member, a front surface is separated from a rear surface in the third direction axis DR3. However, the first to third direction axes DR1 to DR3 are relative to each other, and thus the first to third direction axes DR1 to DR3 may be changed to any other directions. Hereinafter, first to third directions correspond to directions respectively indicated in the Figures by the first to third direction axes DR1 to DR3, and thus the first to third directions are assigned with the same reference numerals as those of the first to third direction axes DR1 to DR3.

Figure 2A:
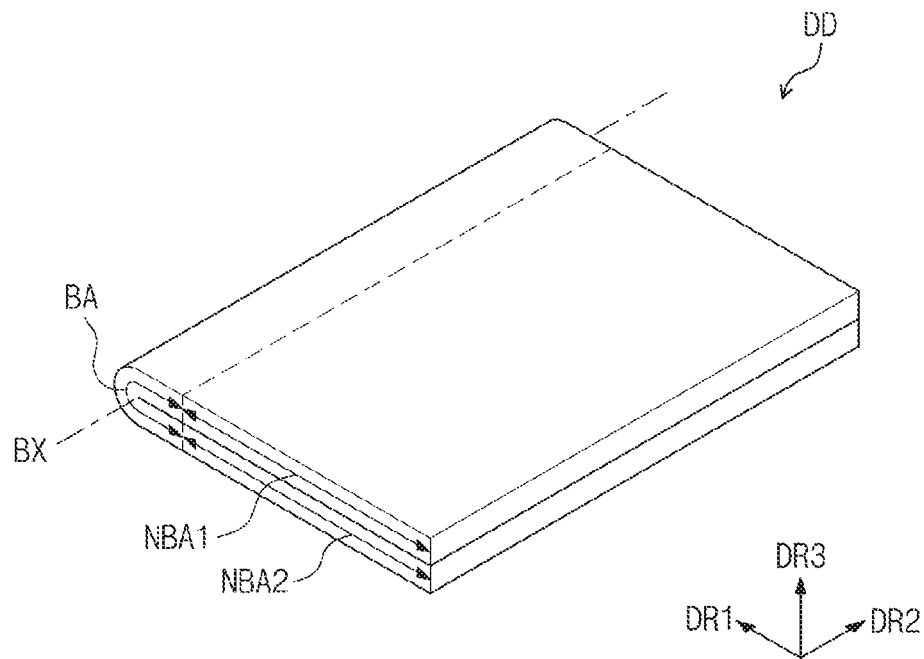
FIG. 2A is a perspective view of a second position of the display device of FIG. 1.
Figure 2B:
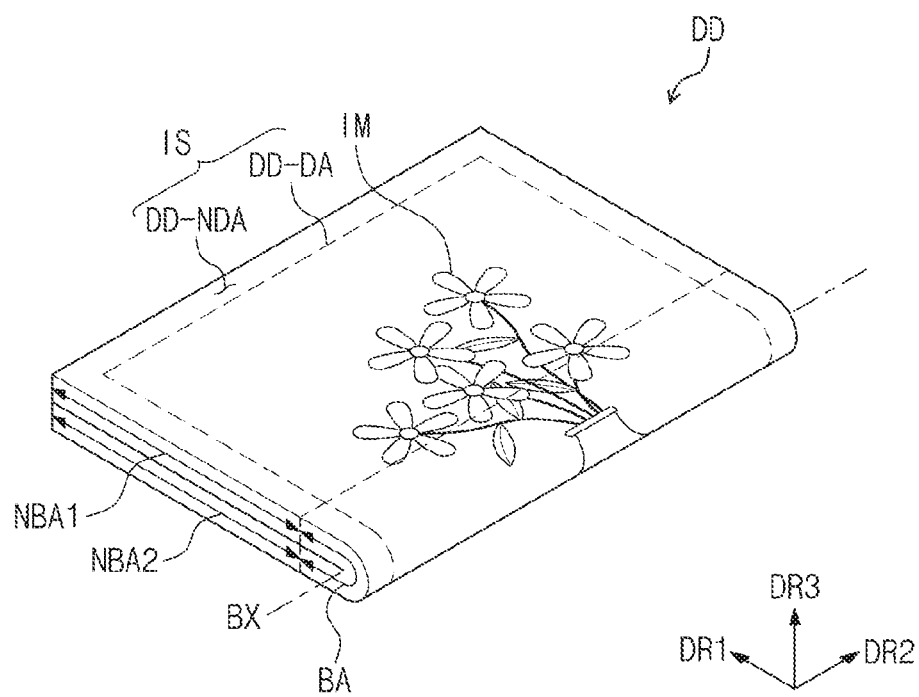
FIG. 2B is a perspective view of a third position of the display device of FIG. 1.

FIGS. 1, 2A, and 2B show a foldable display device as only a representative example of a multitude of embodiments of the display device DD. The flexible display device DD may be a rollable display device or a bendable display device. The display device DD may be a flat rigid display device. The flexible display device DD may be a large-sized electronic item, such as a television set, a monitor, and so on, as well as a small and medium-sized electronic item, such as a mobile phone, a tablet, a car navigation unit, a game unit, a smart watch, and so on.

Referring to FIG. 1, the display surface IS of the flexible display device DD may include a plurality of areas. The flexible display device DD includes a display area DD-DA in which the image IM is displayed and a non-display area DD-NDA disposed adjacent to the display area DD-DA. The image IM is not displayed in the non-display area DD-NDA. FIG. 1 shows an image of a vase as the image IM. The display area DD-DA has a substantially quadrangular shape, and the non-display area DD-NDA surrounds the display area DD-DA. The shape of the display area DD-DA and the shape of the non-display area DD-NDA may be designed relative to each other and have differing configurations in other embodiments.

Referring to FIGS. 1, 2A, and 2B, the display device DD is divided into a plurality of areas in accordance with the operation state thereof. The display device DD includes a bending area BA bent with respect to a bending axis BX, a first non-bending area NBA1 that is not bent, and a second non-bending area NBA2 that is not bent. As shown in FIG. 2A, the display device DD may be inwardly bent such that the display surface IS of the first non-bending area NBA1 faces the display surface IS of the second non-bending area NBA2. As shown in FIG. 2B, the display device DD may be outwardly bent to allow the display surface IS to be exposed even in a bent state.

The display device DD may include a plurality of bending areas BA. In addition, the bending area BA may be defined to correspond to the user's operation performed on the display device DD. For instance, different from the embodiment(s) shown in FIGS. 2A and 2B, the bending area BA may be defined to be substantially parallel to the first direction axis DR1 or may be defined in a diagonal direction. The bending area BA has an area determined depending on a bending radius BR (refer to FIG. 2A) while not being fixed. The display device DD may repeatedly perform the operation modes shown in FIGS. 1 and 2A.

Figure 2C:
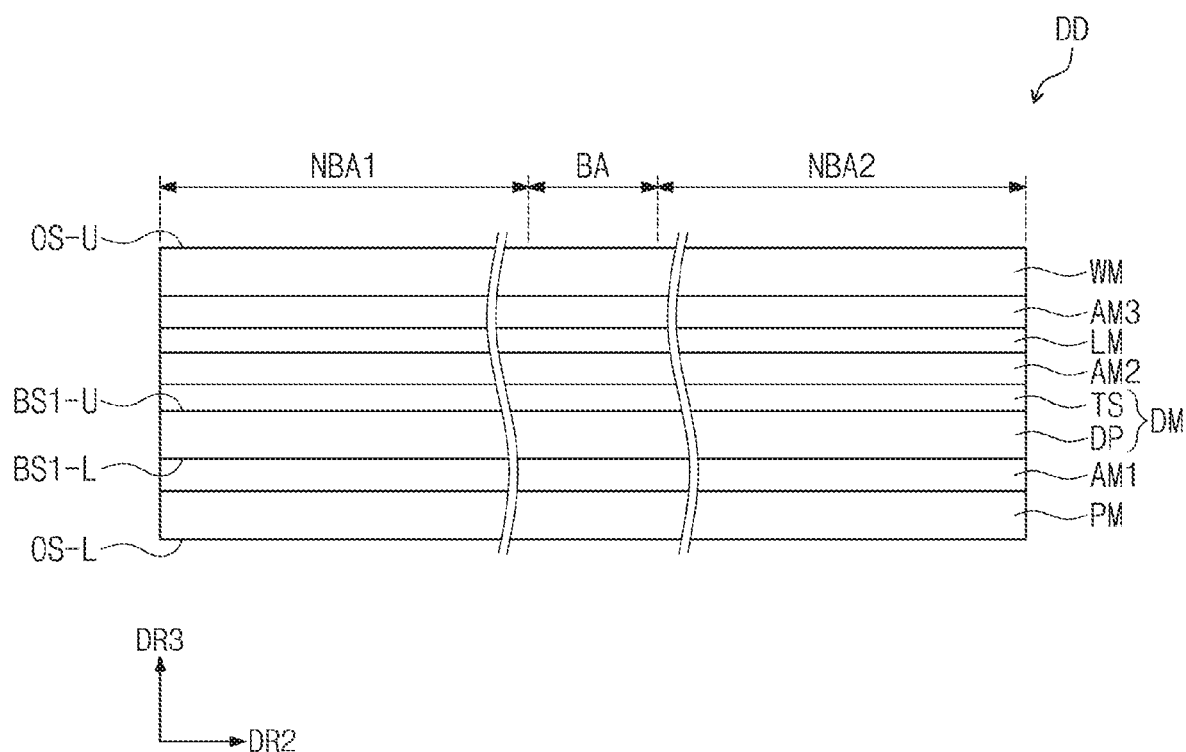
FIG. 2C is a cross-sectional side view of the display device of FIG. 1.

Referring to FIG. 2C, the display device DD includes a protective film PM, a display module DM, an optical member LM, a window WM, a first adhesive member AM1, a second adhesive member AM2, and a third adhesive member AM3. The display module DM is disposed between the protective film PM and the optical member LM. The optical member LM is disposed between the display module DM and the window WM. The first adhesive member AM1 couples the display module DM and the protective film PM, the second adhesive member AM2 couples the display module DM and the optical member LM, and the third adhesive member AM3 couples the optical member LM and the window WM.

The protective film PM protects the display module DM. The protective film PM includes a first outer surface OS-L exposed to the outside and an adhesive surface adhered to the first adhesive member AM1. The protective film PM prevents external moisture from entering the display module DM and absorbs external impacts.

The protective film PM may include a plastic film as a base substrate. The protective film PM may include the plastic film including one selected from the group consisting of polyethersulfone (PES), polyacrylate, polyetherimide (PEI), polyethylenenaphthalate (PEN), polyethyleneterephthalate (PET), polyphenylene sulfide (PPS), polyarylate, polyimide (PI), polycarbonate (PC), poly(arylene ethersulfone), and a mixture thereof.

The material of the protective film PM may include a mixed material of an organic material and an inorganic material without being limited to the plastic resins. The protective film PM includes a porous organic layer and an inorganic material filled in pores of the organic layer. The protective film PM may further include a functional layer formed in the plastic film. The functional layer may include a resin layer. The functional layer may be formed by a coating method. The protective film PM may be omitted in various embodiments.

The window WM may include a plastic film. The window WM may have a multi-layer structure. The window WM may have the multi-layer structure of a glass substrate, a plastic film, or a plastic substrate. The window WM may further include a bezel pattern. The multi-layer structure of the window WM may be formed through consecutive processes or an adhesive process using an adhesive.

The optical member LM reduces a reflectance of an external light. The optical member LM may include at least a polarizing film. The optical member LM further includes a retardation film. The optical member LM may be omitted in various embodiments.

The display module DM may include an organic light emitting display panel DP and a touch sensing unit TS. The touch sensing unit TS may be directly disposed on the organic light emitting display panel DP. In the following descriptions, the expression "a first component is directly disposed on a second component" means that the first and second components may be formed through consecutive processes without being attached to each other by using a separate adhesive layer.

The organic light emitting display panel DP generates the image IM (refer to FIG. 1) corresponding to image data input thereto. The organic light emitting display panel DP may include a first display panel surface BS1-L and a second display panel surface BS1-U facing the first display panel surface BS1-L in the thickness direction DR3. The organic light emitting display panel DP will be described as a representative example of the display panel DP.

The touch sensing unit TS obtains coordinate information of an external input. The touch sensing unit TS senses the external input in an electrostatic capacitive manner.

The display module DM may further include an anti-reflection layer. The anti-reflection layer may include a stack structure of a color filter or a conductive layer/an insulating layer/a conductive layer. The anti-reflection layer absorbs or polarizes the light from the outside thereof to reduce the reflectance of the external light. The anti-reflection layer may replace the function of the optical member LM.

Each of the first, second, and third adhesive members AM1, AM2, and AM3 may be, but not limited to, an organic adhesive layer, such as an optically clear adhesive film (OCA), an optically clear resin (OCR), or a pressure sensitive adhesive film (PSA). The organic adhesive layer may include a polyurethane-based adhesive material, a polyacryl-based adhesive material, a polyester-based adhesive material, a poly epoxy-based adhesive material, or a polyvinyl acetate-based adhesive material. Consequently, the organic adhesive layer may correspond to one organic layer.

The display device DD may further include a frame structure supporting the functional layer to maintain the state shown in FIGS. 1, 2A, and 2B. The frame structure may have a joint structure or a hinge structure.

Figure 3A:
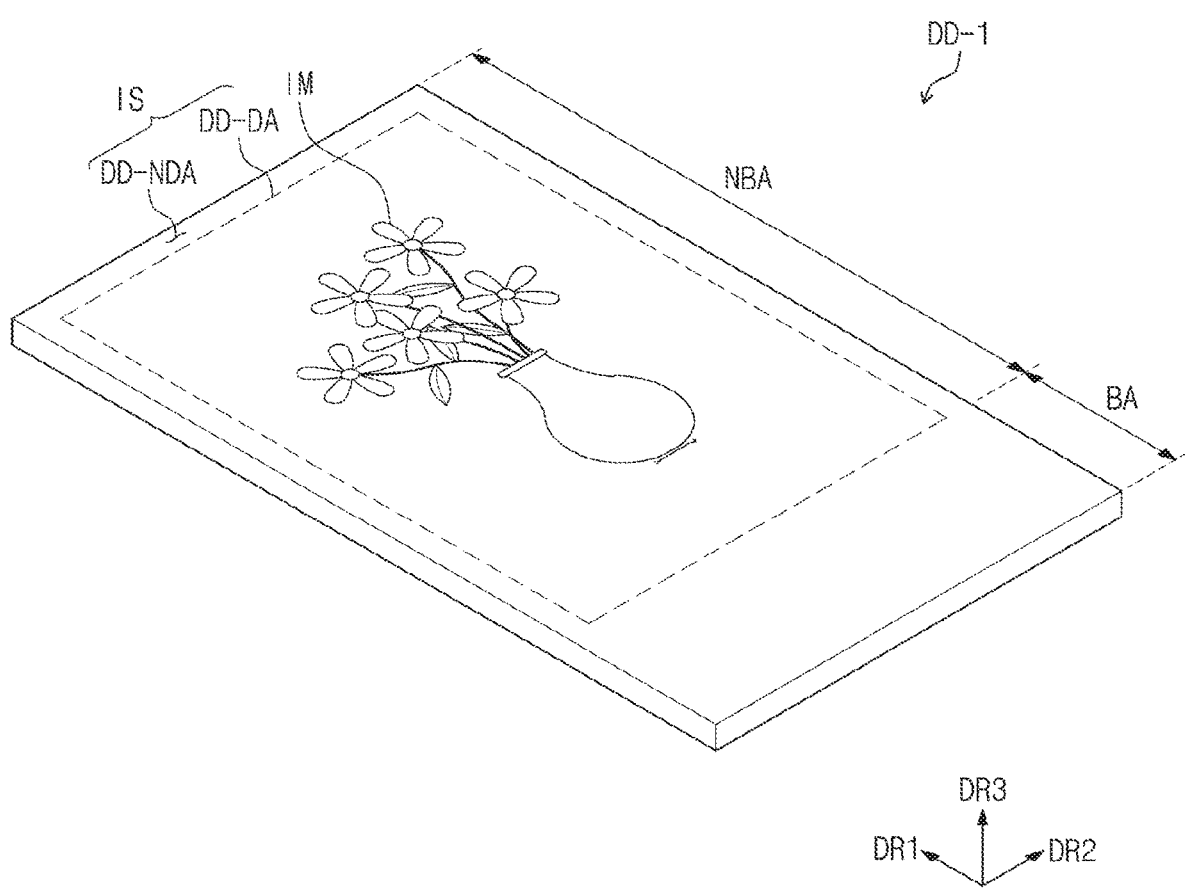
FIGS. 3A and 3B are perspective views of a second embodiment of a display device DD-1 constructed according to the principles of the invention.
Figure 3B:
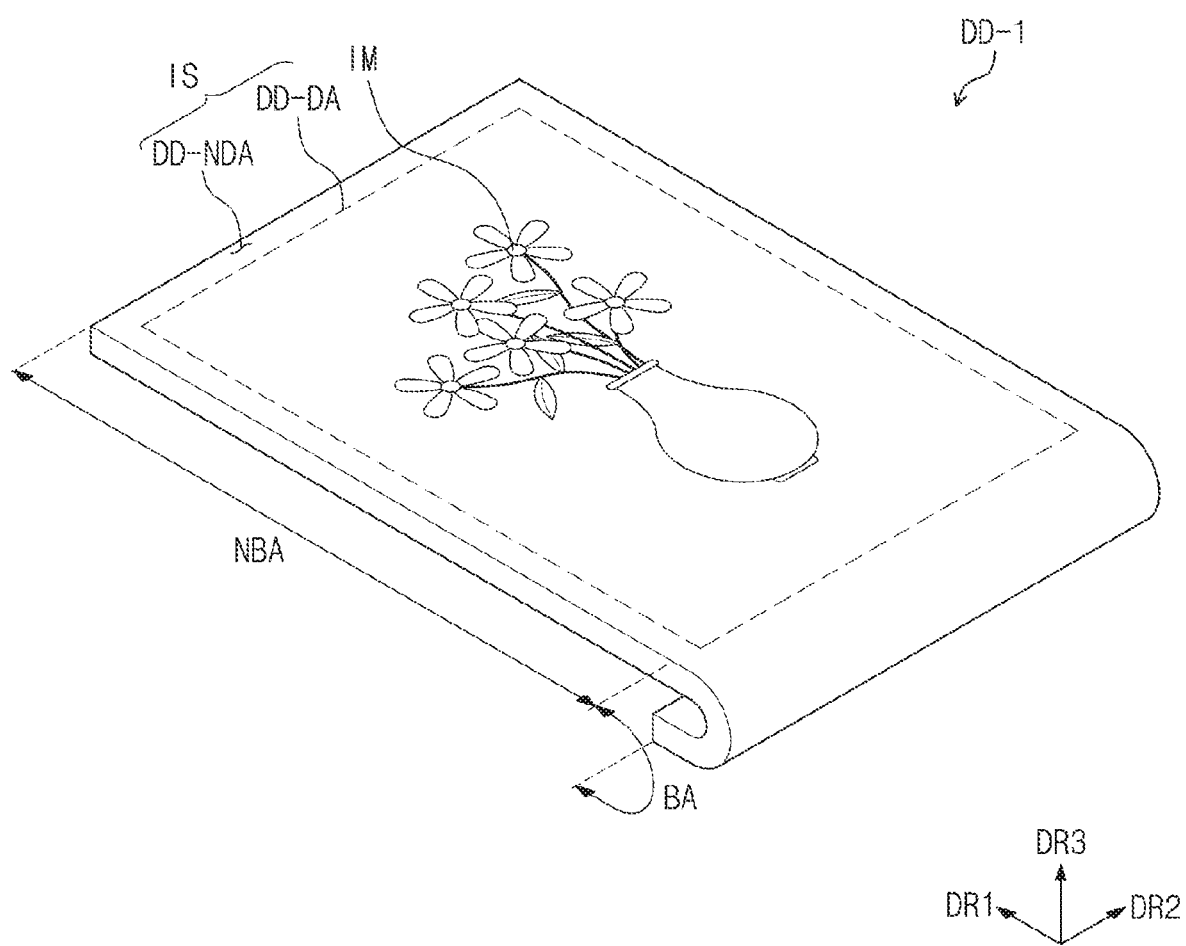

FIG. 3A shows the display device DD-1 in an unfolded state, and FIG. 3B shows the display device DD-1 in a bent state.

The display device DD-1 may include one bending area BA and one non-bending area NBA. The non-display area DD-NDA of the display device DD-1 is bent, however, the bent area of the display device DD-1 may be changed.

Different from the display device DD shown in FIGS. 1, 2A, and 2B, the display device DD-1 may be fixed in one state while being operated. The display device DD-1 may be operated in the bent state as shown in FIG. 3B. The display device DD-1 may be fixed to a frame while being bent, and the frame may be coupled to a housing of an electronic device.

The display device DD-1 may have substantially the same cross-sectional structure as that shown in FIG. 2C. However, the non-bending area NBA and the bending area BA may have different stack structures from each other. The non-bending area NDA may have substantially the same cross-sectional structure as that shown in FIG. 2C, and the bending area BA may have a cross-sectional structure different from that shown in FIG. 2C. The optical member LM and the window WM might not be disposed in the bending area BA. That is, the optical member LM and the window WM might be disposed only in the non-bending area NBA. The second and third adhesive members AM2 and AM3 might not be disposed in the bending area BA.

Figure 4A:
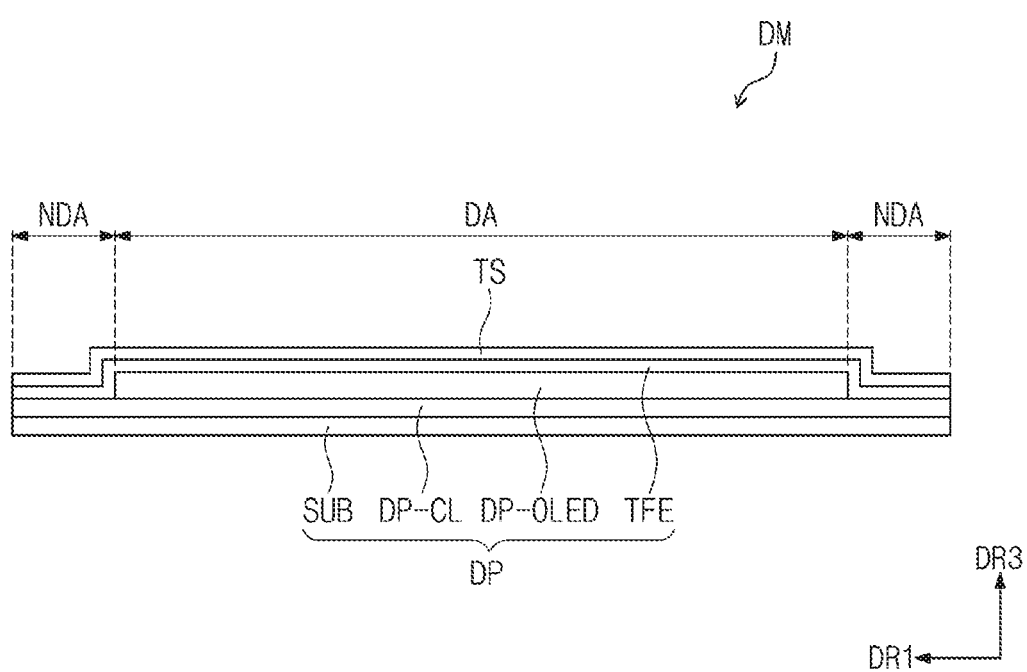
FIG. 4A is a schematic cross-sectional side view of a display module that may be employed in display devices of the invention.

Referring to FIG. 4A, the organic light emitting display panel DP may include a base layer SUB, a circuit layer DP-CL disposed on the base layer SUB, a device layer DP-OLED, and a thin film encapsulation layer TFE. The base layer SUB may include at least one plastic film. The base layer SUB may be a flexible substrate and may include a plastic substrate, a glass substrate, a metal substrate, or an organic/inorganic-mixed material substrate.

The circuit layer DP-CL may include a plurality of insulating layers, a plurality of conductive layers, and a semiconductor layer. The conductive layers of the circuit layer DP-CL may form signal lines or a control circuit of the pixel. The device layer DP-OLED may include organic light emitting diodes. The thin film encapsulation layer TFE may include an inorganic layer and an organic layer. The thin film encapsulation layer TFE may include at least two inorganic layers and an organic layer disposed between them. The inorganic layers protect the device layer DP-OLED from moisture and oxygen, and the organic layer protects the device layer DP-OLED from foreign substance such as dust. The inorganic layer may include a silicon nitride layer, a silicon oxynitride layer, and a silicon oxide layer. The organic layer may include an acryl-based organic material, but it should not be limited thereto or thereby.

The touch sensing unit TS may be directly disposed on the thin film encapsulation layer TFE. The touch sensing unit TS may include touch sensors and touch signal lines. The sensors and the touch signal lines may have a singly-layer structure or a multi-layer structure.

The touch sensors and the touch signal lines may include indium tin oxide (ITO), indium zinc oxide (IZO), zinc oxide (ZnO), indium tin zinc oxide (ITZO), PEDOT, a metal nano-wire, and a graphene. The touch sensors and the touch signal lines may include a metal layer, e.g., molybdenum, silver, titanium, copper, aluminum, or an alloy thereof. The touch sensors and the touch signal lines may have the same layer structure or different layer structures. The touch sensing unit TS will be described in detail later.

Figure 4B:
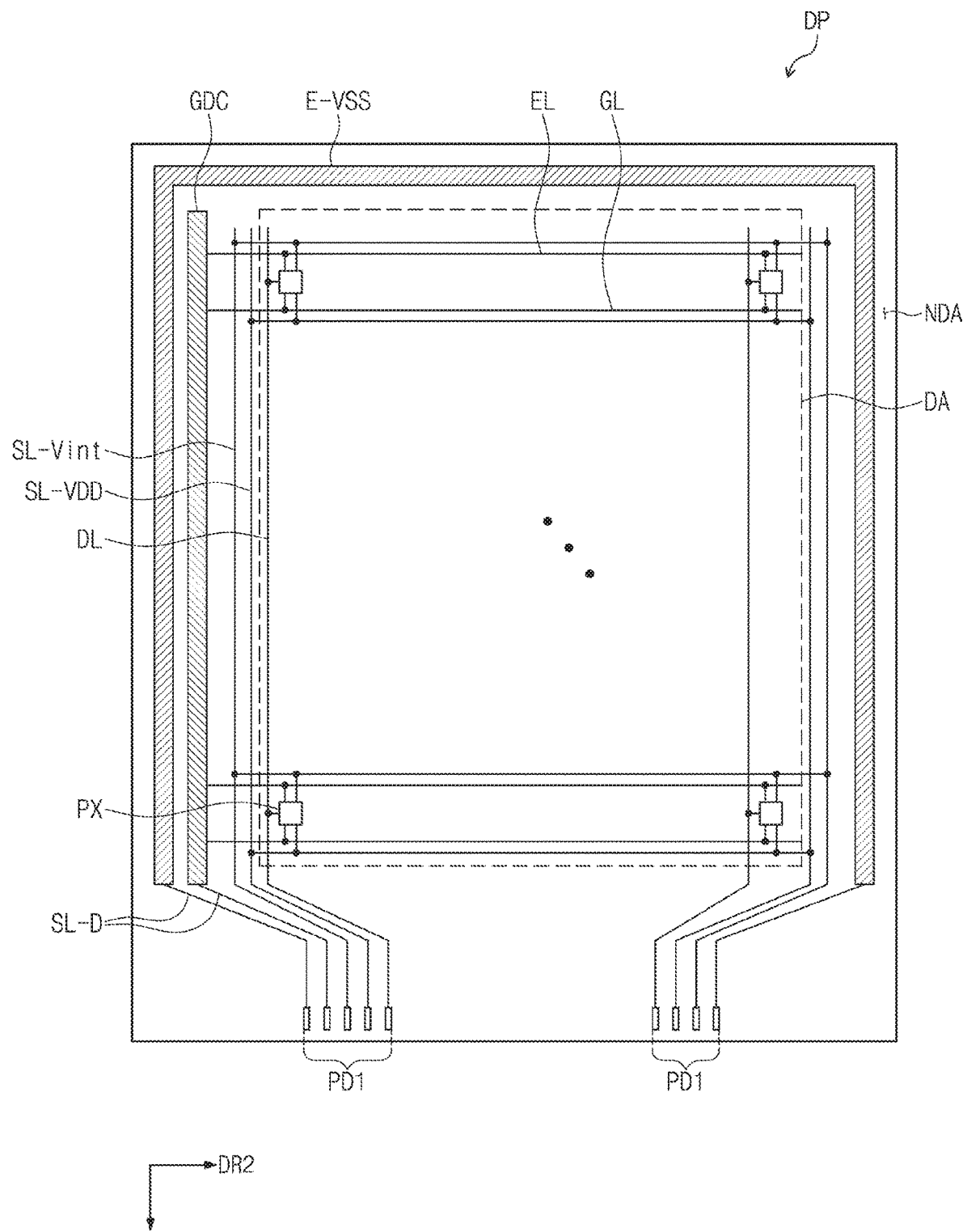
FIG. 4B is a plan view of an embodiment of an organic light emitting display panel that may be employed in display devices of the invention.

Referring to FIG. 4B, the organic light emitting display panel DP may include a display area DA and a non-display area NDA when viewed in a plan view. The display area DA and the non-display area NDA of the organic light emitting display panel DP respectively correspond to the display area DD-DA (refer to FIG. 1) and the non-display area DD-NDA (refer to FIG. 1) of the display device DD (refer to FIG. 1). The display area DA and the non-display area NDA of the organic light emitting display panel DP might not be required to be identical to the display area DD-DA (refer to FIG. 1) and the non-display area DD-NDA (refer to FIG. 1) of the display device DD (refer to FIG. 1), and the display area DA and the non-display area NDA of the organic light emitting display panel DP might be changed in accordance with the structure and design of the organic light emitting display panel DP.

The organic light emitting display panel DP may include a plurality of pixels PX. An area in which the pixels PX are arranged is referred to as the display area DA. The non-display area NDA as shown is defined along an edge of the display area DA.

The organic light emitting display panel DP may include gate lines GL, data lines DL, light emitting lines EL, a control signal line SL-D, an initialization voltage line SL-Vint, a voltage line SL-VDD, a first pad PD1, and a power supply line E-VSS.

Each of the gate lines GL may be connected to a corresponding pixel of the pixels PX, and each of the data lines DL may be connected to a corresponding pixel of the pixels PX. Each of the light emitting lines EL may be arranged to be substantially parallel to a corresponding gate line of the gate lines GL. The control signal line SL-D applies a control signal to a gate driving circuit GDC. The initialization voltage line SL-Vint applies an initialization voltage to the pixels PX. The voltage line SL-VDD may be connected to the pixels PX to apply a first voltage to the pixels PX. The voltage line SL-VDD may include a plurality of lines extending in the first direction DR1 and a plurality of lines extending in the second direction DR2. The power supply line E-VSS may be disposed in the non-display area NDA to surround three sides of the display area DA. The power supply line E-VSS applies a common voltage (e.g., a second voltage) to the pixels PX. The common voltage has a level lower than that of the first voltage.

The gate driving circuit GDC may be disposed at one side portion of the non-display area NDA and connected to the gate lines GL and the light emitting lines EL. Some of the gate lines GL, the data lines DL, the light emitting lines EL, the control signal line SL-D, the initialization voltage line SL-Vint, and the voltage line SL-VDD may be disposed on the same layer, and the others of the gate lines GL, the data lines DL, the light emitting lines EL, the control signal line SL-D, the initialization voltage line SL-Vint, and the voltage line SL-VDD may be disposed on different layers.

The first pad PD may be connected to an end of the data lines DL, the control signal line SL-D, the initialization voltage line SL-Vint, and the voltage line SL-VDD. The first pad PD1 may be disposed at one side of the non-display area NDA.

Figure 5:
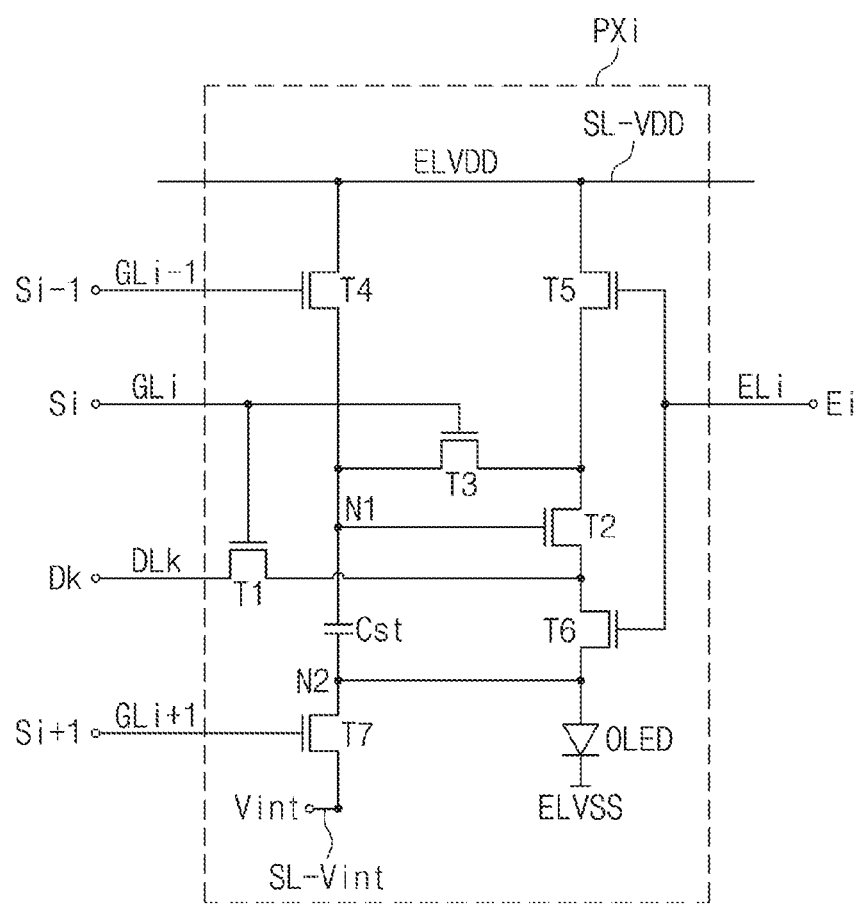
FIG. 5 is an equivalent circuit diagram of an embodiment of a pixel that may be employed in display devices of the invention.

FIG. 5 shows an i-th pixel PXi connected to a k-th data line DLk among the data lines DL (refer to FIG. 4B).

The i-th pixel PXi may include an organic light emitting diode OLED and a pixel driving circuit controlling the organic light emitting diode OLED. The driving circuit may include seven transistors T1 to T7 and one storage capacitor Cst.

The driving transistor controls a driving current applied to the organic light emitting diode OLED. An output electrode of a second transistor T2 may be electrically connected to the organic light emitting diode OLED. The output electrode of the second transistor T2 directly makes contact with an anode of the organic light emitting diode OLED or may be connected to the anode of the organic light emitting diode OLED via another transistor, e.g., a sixth transistor T6.

A control electrode of a control transistor receives a control signal. The control signal applied to the i-th pixel PXi may include an (i−1)th gate signal Si−1, an i-th gate signal Si, an (i+1)th gate signal Si+1, a data signal Dk, and an i-th light emitting control signal Ei. The control transistor as shown may include a first transistor T1 and third to seventh transistors T3 to T7.

The first transistor T1 may include an input electrode connected to the k-th data line DLk, a control electrode connected to an i-th gate line GLi, and an output electrode connected to the output electrode of the second transistor T2. The first transistor T1 may be turned on the gate signal Si (hereinafter, referred to as the "i-th gate signal") applied to the i-th gate line GLi to apply the data signal Dk applied to the k-th data line to the storage capacitor Cst.

Figure 6A:
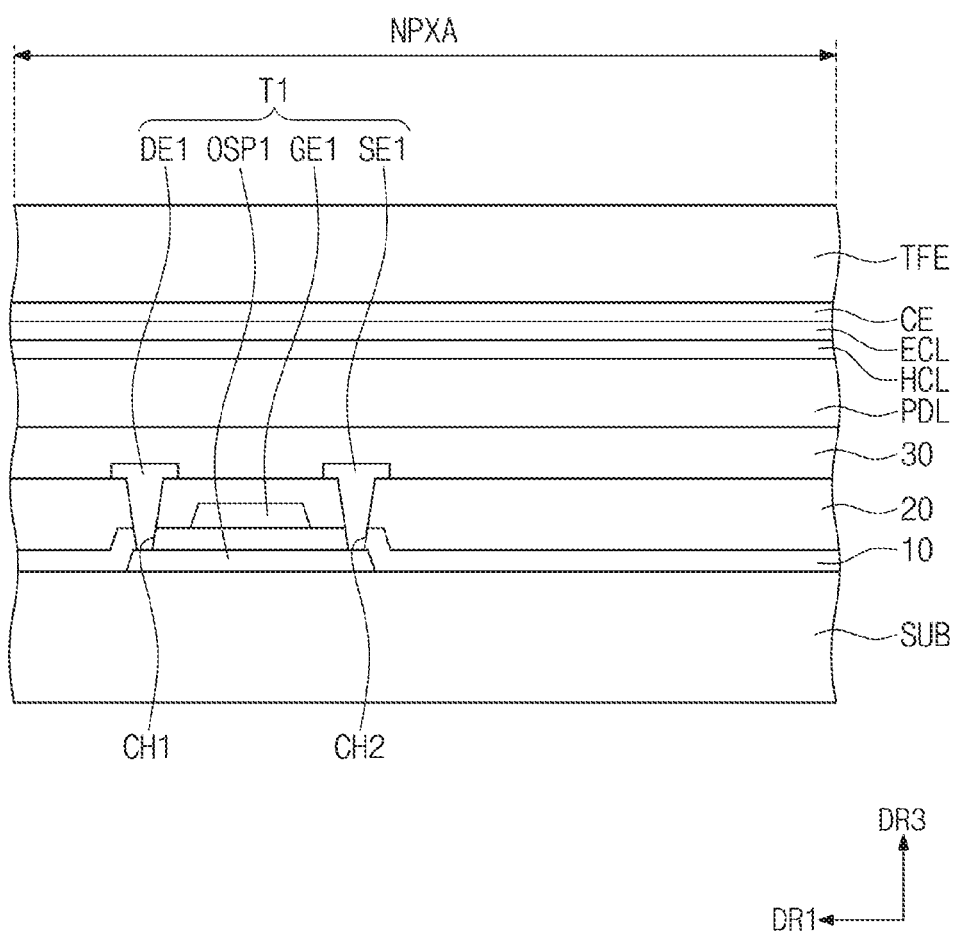
FIG. 6A is a fragmented cross-sectional side view of an embodiment of an organic light emitting display panel that may be employed in display devices of the invention.
Figure 6B:
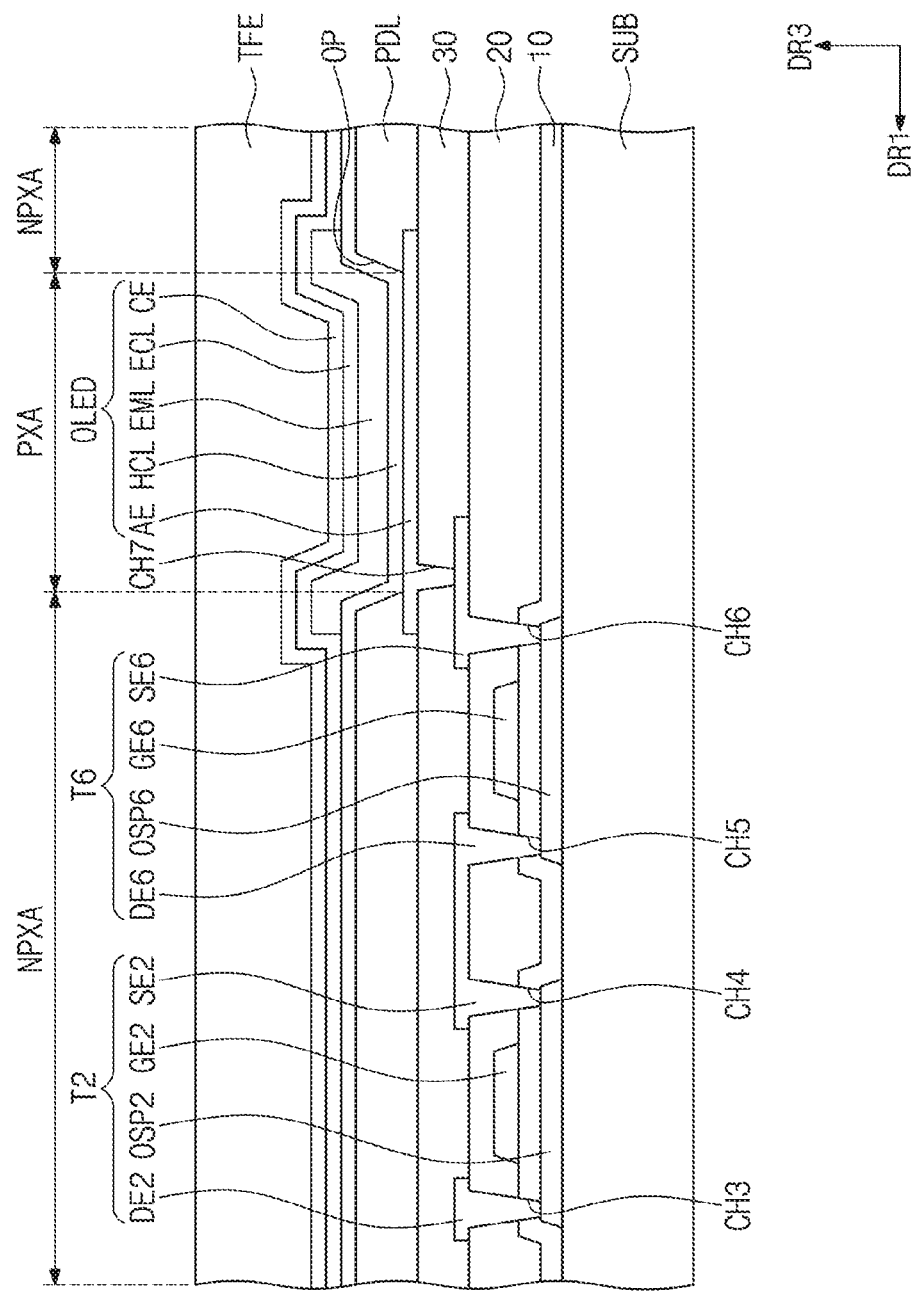
FIG. 6B is a fragmented cross-sectional side view of an embodiment of an organic light emitting display panel that may be employed in display devices of the invention.

Referring to FIGS. 6A and 6B, the circuit layer DP-CL may be disposed on the base layer SUB. Functional layers may further be disposed on the base layer SUB. The functional layers include at least one of a barrier layer and a buffer layer.

A semiconductor pattern OSP1 (hereinafter, referred to as a "first semiconductor pattern) of the first transistor T1, a semiconductor pattern OSP2 (hereinafter, referred to as a "second semiconductor pattern) of the second transistor T2, and a semiconductor pattern OSP6 (hereinafter, referred to as a "sixth semiconductor pattern) of the sixth transistor T6 may be disposed on the base layer SUB. The first semiconductor pattern OSP1, the second semiconductor pattern OSP2, and the sixth semiconductor pattern OSP6 may include amorphous silicon, polysilicon, or metal oxide semiconductor.

A first insulating layer 10 may be disposed on the first semiconductor pattern OSP1, the second semiconductor pattern OSP2, and the sixth semiconductor pattern OSP6. In FIGS. 6A and 6B, the first insulating layer 10 may be provided in a layer form to cover the first semiconductor pattern OSP1, the second semiconductor pattern OSP2, and the sixth semiconductor pattern OSP6, but it should not be limited thereto or thereby. That is, the first insulating layer 10 may be provided in pattern form corresponding to the first semiconductor pattern OSP1, the second semiconductor pattern OSP2, and the sixth semiconductor pattern OSP6.

The first insulating layer 10 may include a plurality of inorganic thin layers. The inorganic thin layers include the silicon nitride layer, the silicon oxynitride layer, and the silicon oxide layer.

A control electrode GE1 (hereinafter, referred to as a "first control electrode") of the first transistor T1, a control electrode GE2 (hereinafter, referred to as a "second control electrode") of the second transistor T2, a control electrode GE6 (hereinafter, referred to as a "sixth control electrode") of the sixth transistor T6 may be disposed on the first insulating layer 10. The first control electrode GE1, the second control electrode GE2, and the sixth control electrode GE6 may be formed through the same photolithography process as the gate lines GL (refer to FIG. 5A).

A second insulating layer 20 may be disposed above the first insulating layer 10 to cover the first control electrode GE1, the second control electrode GE2, and the sixth control electrode GE6. The second insulating layer 20 provides a flat upper surface. The second insulating layer 20 may include an organic material and/or an inorganic material.

An input electrode SE1 (hereinafter, referred to as a "first input electrode") and an output electrode DE1 (hereinafter, referred to as a "first output electrode") of the first transistor T1, an input electrode SE2 (hereinafter, referred to as a "second input electrode") and an output electrode DE2 (hereinafter, referred to as a "second output electrode") of the second transistor T2, and an input electrode SE6 (hereinafter, referred to as a "sixth input electrode") and an output electrode DE6 (hereinafter, referred to as a "sixth output electrode") of the sixth transistor T6 may be disposed on the second insulating layer 20.

The first input electrode SE1 and the first output electrode DE1 may be connected to the first semiconductor pattern OSP1 respectively through a first contact hole CH1 and a second contact hole CH2, which may be formed through the first and second insulating layers 10 and 20. The second input electrode SE2 and the second output electrode DE2 may be connected to the second semiconductor pattern OSP2 respectively through a third contact hole CH3 and a fourth contact hole CH4, which may be formed through the first and second insulating layers 10 and 20. The sixth input electrode SE6 and the sixth output electrode DE6 may be connected to the sixth semiconductor pattern OSP6 respectively through a fifth contact hole CH5 and a sixth contact hole CH6, which may be formed through the first and second insulating layers 10 and 20. Meanwhile, according to another embodiment, each of the first, second, and sixth transistors T1, T2, and T6 may have a bottom gate structure.

A third insulating layer 30 may be disposed above the second insulating layer 20 to cover the first input electrode SE1, the second input electrode SE2, the sixth input electrode SE6, the first output electrode DE1, the second output electrode DE2, and the sixth output electrode DE6. The third insulating layer 30 may include an organic layer and/or an inorganic layer. In particular, the third insulating layer 30 may include an organic material to provide a flat surface.

One of the first insulating layer 10, the second insulating layer 20, and the third insulating layer 30 may be omitted in accordance with the circuit structure of the pixel. Each of the second and third insulating layers 20 and 30 may be referred to as an interlayer. The interlayer may be disposed between conductive patterns, e.g., upper and lower conductive patterns, to insulate the conductive patterns from each other.

The pixel definition layer PDL and the organic light emitting diode OLED may be disposed on the third insulating layer 30. The anode AE may be disposed on the third insulating layer 30. The anode AE may be connected to the sixth input electrode SE6 through a seventh contact hole CH7 defined through the third insulating layer 30. The pixel definition layer PDL may be provided with an opening OP defined therethrough. At least a portion of the anode AE may be exposed through the opening OP of the pixel definition layer PDL.

The pixel PX (refer to FIG. 4B) may be disposed in a pixel area when viewed in a plan view. The pixel area may include a light emitting area PXA and a non-light emitting area NPXA adjacent to the light emitting area PXA. The non-light emitting area NPXA may surround the light emitting area PXA. The light emitting area PXA as shown is defined to correspond to a portion of the anode AE exposed through the opening OP.

A hole control layer HCL may be disposed in the light emitting area PXA and the non-light emitting area NPXA. A common layer like the hole control layer HCL may be formed in the plural pixels PX (refer to FIG. 5A).

An organic light emitting layer EML may be disposed on the hole control layer HCL. The organic light emitting layer EML may be disposed in an area corresponding to the opening OP. That is, the organic light emitting layer EML may be patterned into plural parts, and the parts may be respectively disposed in the pixels PX. The patterned organic light emitting layer EML is shown as a representative example, but the organic light emitting layer EML may be disposed in the pixels PX. In this case, the organic light emitting layer EML may generate a white light. In addition, the organic light emitting layer EML may have a multi-layer structure.

An electron control layer ECL may be disposed on the organic light emitting layer EML. The electron control layer ECL may be disposed in the pixels PX (refer to FIG. 4B).

A cathode CE may be disposed on the electron control layer ECL. The cathode CE may be disposed in the pixels PX.

The thin film encapsulation layer TEF may be disposed on the cathode CE. The thin film encapsulation layer TFE may be disposed in the pixels PX. The thin film encapsulation layer TFE may include at least one inorganic layer and at least one organic layer. The thin film encapsulation layer TFE may include a plurality of inorganic layers and a plurality of organic layers alternately stacked with the inorganic layers. The thin film encapsulation layer TFE may directly cover the cathode CE.

Figure 7A:
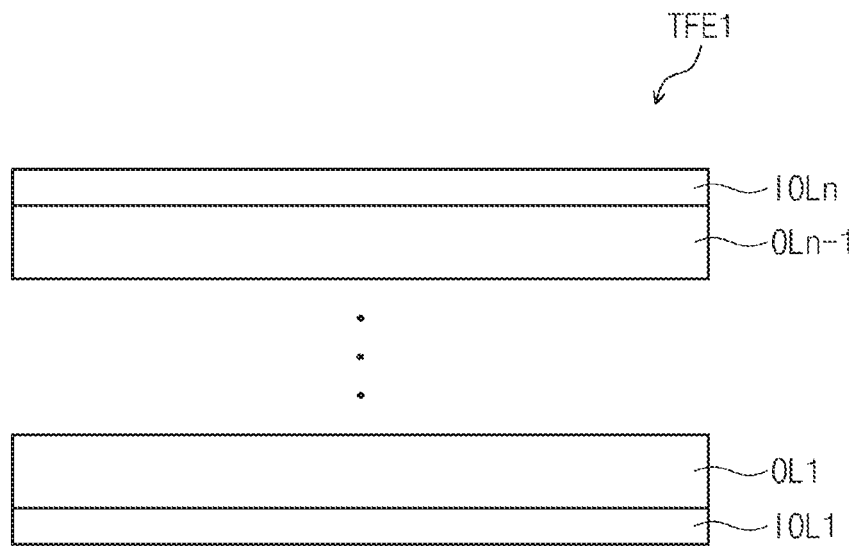
FIGS. 7A to 7C are cross-sectional side views of embodiments of thin film encapsulation layers that may be employed in display devices of the invention.

Referring to FIG. 7A, the thin film encapsulation layer TFE1 may include n inorganic thin layers IOL1 to IOLn, and a first inorganic thin layer among the n thin layers IOL1 to IOLn makes contact with the cathode CE (refer to FIG. 6A).

The first inorganic thin layer IOL1 may be referred to as a "lower inorganic thin layer", and the inorganic thin layers except for the first inorganic thin layer IOL1 among the n inorganic thin layers IOL1 to IOLn may be referred to as "upper inorganic thin layers".

The thin film encapsulation layer TFE1 may include n–1 organic thin layers OL1 to OLn–1, and the n–1 organic thin layers OL1 to OLn–1 may be alternately arranged with the n inorganic thin layers IOL1 to IOLn. The n–1 organic thin layers OL1 to OLn–1 may have a thickness greater than that of the n inorganic thin layers IOL1 to IOLn.

Each of the n inorganic thin layers IOL1 to IOLn may have a single-layer structure containing one type of material or a multi-layer structure containing plural different types of material. Each of the n–1 organic thin layers OL1 to OLn–1 may be formed by depositing organic monomers. The organic monomers may include an acryl-based monomer. The thin film encapsulation layer TFE1 may further include an n-th organic thin layer.

Figure 7B:
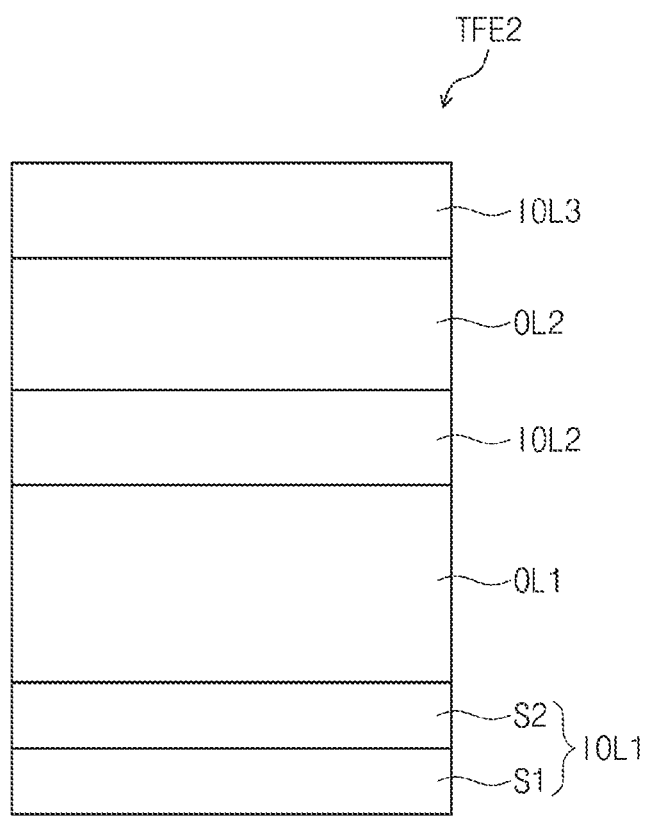
Figure 7C:
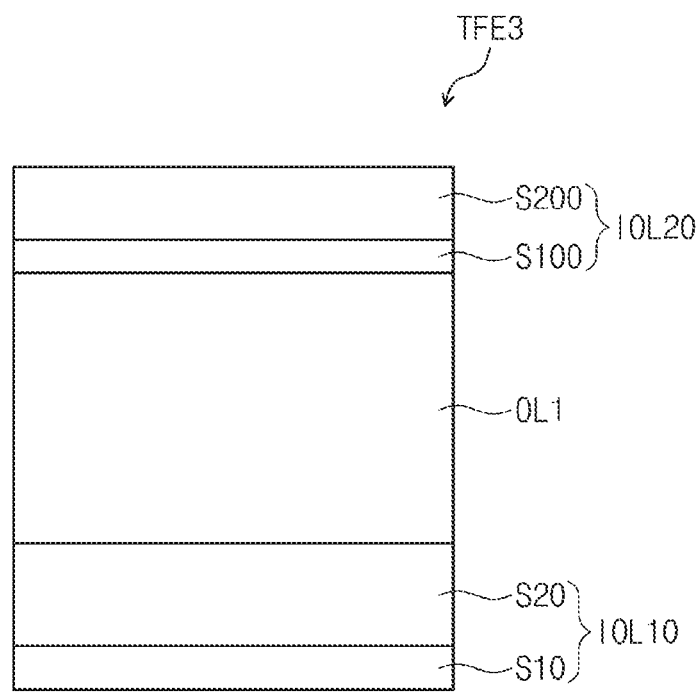

Referring to FIGS. 7B and 7C, the inorganic thin layers included in each of the thin film encapsulation layers TFE2 and TFE3 may include the same inorganic material or different inorganic materials from each other and may have the same thickness or different thicknesses. The organic thin layers included in each of the thin film encapsulation layers TFE2 and TFE3 may include the same organic material or different organic materials from each other and may have the same thickness or different thicknesses.

As shown in FIG. 7B, the thin film encapsulation layer TFE2 may include the first inorganic thin layer IOL1, the first organic thin layer OL1, the second inorganic thin layer IOL2, the second organic thin layer OL2, and the third inorganic thin layer IOL3, which may be sequentially stacked.

The first inorganic thin layer IOL1 may have a double-layer structure. A first sub-layer S1 and a second sub-layer S2 may have different inorganic materials.

As shown in FIG. 7C, the thin film encapsulation layer TFE2 may include a first inorganic thin layer IOL10, a first organic thin layer OL1, and a second inorganic thin layer IOL20, which may be sequentially stacked. The first inorganic thin layer IOL10 may have a double-layer structure. A first sub-layer S10 and a second sub-layer S20 may have different inorganic materials. The first organic thin layer OL1 may be an organic layer including a polymer, and the second inorganic thin layer IOL20 may have a double-layer structure. The second inorganic thin layer IOL20 may include a first sub-layer S100 and a second sub-layer S200, which may be deposited in different environments. The first sub-layer S100 may be deposited at lower power, and the second sub-layer S200 may be deposited at high power. The first and second sub-layers S100 and S200 may include the same inorganic material.

Figure 8A:
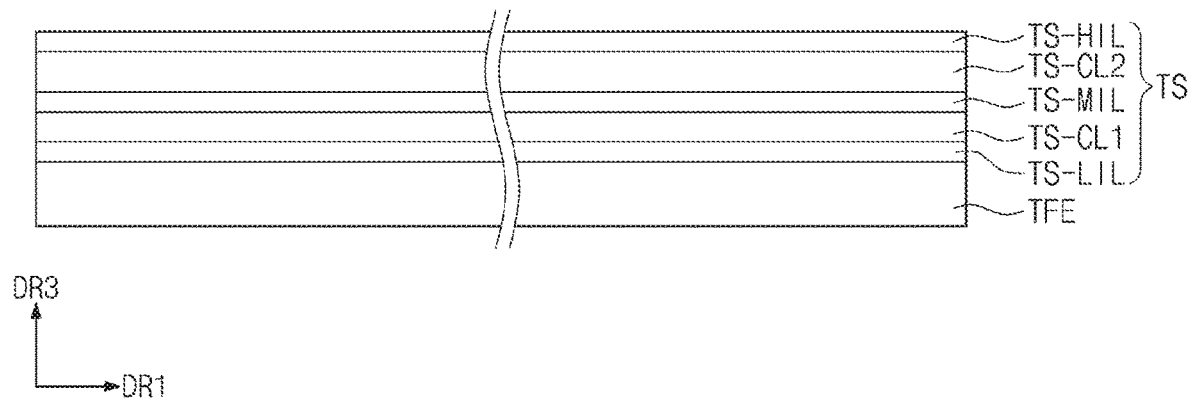
FIG. 8A is a broken, cross-sectional side view of an embodiment of a touch sensing unit that may be employed in display devices of the invention.

Referring to FIG. 8A, the touch sensing unit TS may include a lower insulating layer TS-LIL, an intermediate insulating layer TS-MIL, a first conductive layer TS-CL1, an upper insulating layer TS-HIL, and a second conductive layer TS-CL2. The lower insulating layer TS-LIL may be directly disposed on the encapsulation layer TFE. The first conductive layer TS-CL1 may be directly disposed on the lower insulating layer TS-LIL, but it should not be limited thereto or thereby. That is, another inorganic layer (e.g., a buffer layer) may be further disposed between the first conductive layer TS-CL1 and the lower insulating layer TS-LIL.

Each of the first conductive layer TS-CL1 and the second conductive layer TS-CL2 may have a single-layer structure or a multi-layer structure of plural layers stacked in the third direction DR3. The conductive layer having the multi-layer structure may include two or more layers among transparent conductive layers and metal layers. The conductive layer having the multi-layer structure may include metal layers including different metals from each other. The transparent conductive layer may include indium tin oxide (ITO), indium zinc oxide (IZO), zinc oxide (ZnO), indium tin zinc oxide (ITZO), PEDOT, a metal nano-wire, or a graphene. The metal layer may include molybdenum, silver, titanium, copper, aluminum, or an alloy thereof.

Each of the first conductive layer TS-CL1 and the second conductive layer TS-CL2 may include a plurality of patterns. The first conductive layer TS-CL1 may include first conductive patterns, and the second conductive layer TS-CL2 may include second conductive patterns. Each of the first and second conductive patterns may include touch electrodes and touch signal lines.

Each of the lower insulating layer TS-LIL, the intermediate insulating layer TS-MIL, and the upper insulating layer TS-HIL may include an inorganic material or an organic material. The inorganic material may include at least one of aluminum oxide, titanium oxide, silicon oxide, silicon nitride, silicon oxynitride, zirconium oxide, and hafnium oxide. The organic material may include at least one of an acryl-based resin, a methacryl-based resin, polyisoprene, a vinyl-based resin, an epoxy-based resin, a urethane-based resin, a cellulose-based resin, a siloxane-based resin, a polyimide-based resin, a polyamide-based resin, and a perylene-based resin.

Each of the lower insulating layer TS-LIL, the intermediate insulating layer TS-MIL, and the upper insulating layer TS-HIL has a single-layer structure or a multi-layer structure. Each of the lower insulating layer TS-LIL, the intermediate insulating layer TS-MIL, and the upper insulating layer TS-HIL may include at least one of an inorganic layer and an organic layer. The inorganic layer and the organic layer may be formed by a chemical vapor deposition method.

The intermediate insulating layer TS-MIL should not be limited to a specific shape if the intermediate insulating layer TS-MIL insulates the first conductive layer TS-CL1 and the second conductive layer TS-CL2. The shape of the intermediate insulating layer TS-MIL may be determined depending on a shape of the first and second conductive patterns. The intermediate insulating layer TS-MIL entirely covers the thin film encapsulation layer TFE or may include a plurality of insulating patterns. The insulating patterns may be overlapped with first connection parts CP1 and second connection parts CP2 described later.

The two-layer type touch sensing unit has been described, but the touch sensing unit should not be limited to the two-layer type. A single-layer type touch sensing unit may include a conductive layer and an insulating layer covering the conductive layer. The conductive layer may include touch sensors and touch signal lines connected to the touch sensors. The single-layer type touch sensing unit may obtain coordinate information using a self-capacitance method.

Figure 8B:
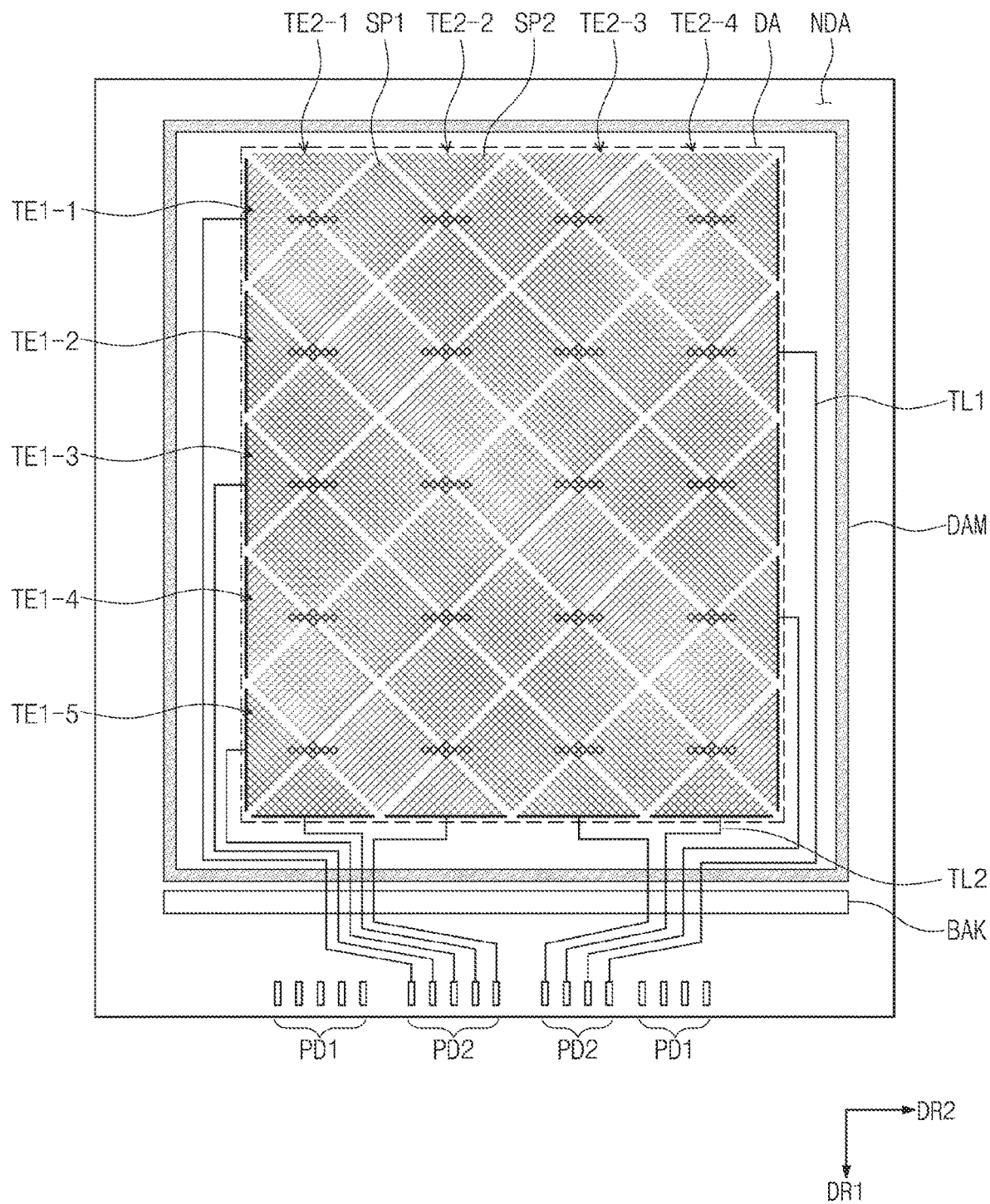
FIGS. 8B to 8E are partial, top sectional views of the touch sensing unit of FIG. 8A at various layers.

Referring to FIG. 8B, the touch sensing unit TS may include first touch electrodes TE1-1 to TE1-5, first touch signal lines TL1 connected to the first touch electrodes TE1-1 to TE1-5, second touch electrodes TE2-1 to TE2-4, second touch signal lines TL2 connected to the second touch electrodes TE2-1 to TE2-4, and a second pad PD2 connected to the first touch signal lines TL1 and the second touch signal lines TL2. FIG. 8B shows the touch sensing unit TS configured to include five first touch electrodes TE1-1 to TE1-5 and four second touch electrodes TE2-1 to TE2-4, but the number of the first touch electrodes and the number of the second touch electrodes should not be limited thereto or thereby.

Each of the first touch electrodes TE1-1 to TE1-5 may have a mesh shape through which a plurality of touch openings may be defined. Each of the first touch electrodes TE1-1 to TE1-5 may include a plurality of first touch sensor parts SP1 and a plurality of first connection parts CP1. The first touch sensor parts SP1 may be arranged in the second direction DR2. Each of the first connection parts CP1 connects two first touch sensor parts SP1 adjacent to each other among the first touch sensor parts SP1. Although not shown in detail, the first touch signal lines TL1 may have the mesh shape.

The second touch electrodes TE2-1 to TE2-4 may be insulated from the first touch electrodes TE1-1 to TE1-5 while crossing the first touch electrodes TE1-1 to TE1-5. Each of the second touch electrodes TE2-1 to TE2-4 may have a mesh shape through which a plurality of touch openings may be defined. Each of the second touch electrodes TE2-1 to TE2-4 may include a plurality of second touch sensor parts SP2 and a plurality of second connection parts CP2. The second touch sensor parts SP2 may be arranged in the first direction DR1. Each of the second connection parts CP2 connects two second touch sensor parts SP2 adjacent to each other among the second touch sensor parts SP2. Although not shown in detail, the second touch signal lines TL2 may have the mesh shape.

The first touch electrodes TE1-1 to TE1-5 may be capacitively coupled to the second touch electrodes TE2-1 to TE2-4. When the touch sensing signals are applied to the first touch electrodes TE1-1 to TE1-5, capacitors may be formed between the first touch sensor parts SP1 and the second touch sensor parts SP2.

A portion of the first touch sensor parts SP1, the first connection parts CP1, the first touch signal lines TL1, the second touch sensor parts SP2, the second connection parts CP2, and the second touch signal lines TL2 may be formed by patterning the first conductive layer TS-CL1 shown in FIG. 8A, and the other portion of the first touch sensor parts SP1, the first connection parts CP1, the first touch signal lines TL1, the second touch sensor parts SP2, the second connection parts CP2, and the second touch signal lines TL2 may be formed by patterning the second conductive layer TS-CL2 shown in FIG. 8A.

To electrically connect conductive patterns disposed on different layers, a contact hole may be formed through the intermediate insulating layer TS-MIL shown in FIG. 8A. Hereinafter, the touch sensing unit TS will be described with reference to FIGS. 8C to 8E.

Figure 8C:
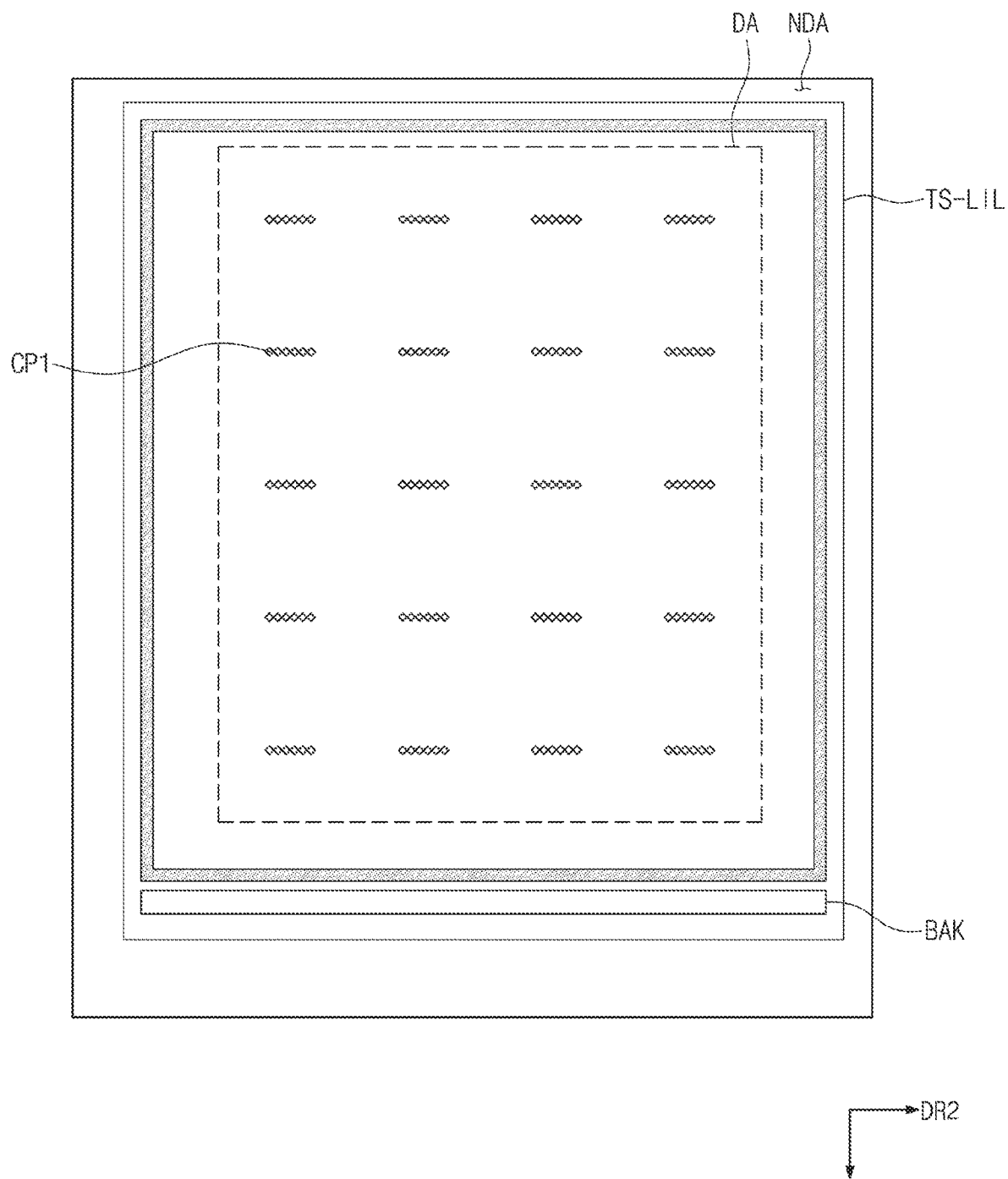

Referring to FIG. 8C, the first conductive patterns may be disposed on the lower insulating layer TS-LIL. The first conductive patterns include bridge patterns CP1. The bridge patterns CP1 may be directly disposed on the lower insulating layer TS-LIL. The bridge patterns CP1 correspond to the second connection parts CP2 shown in FIG. 8B.

Figure 8D:
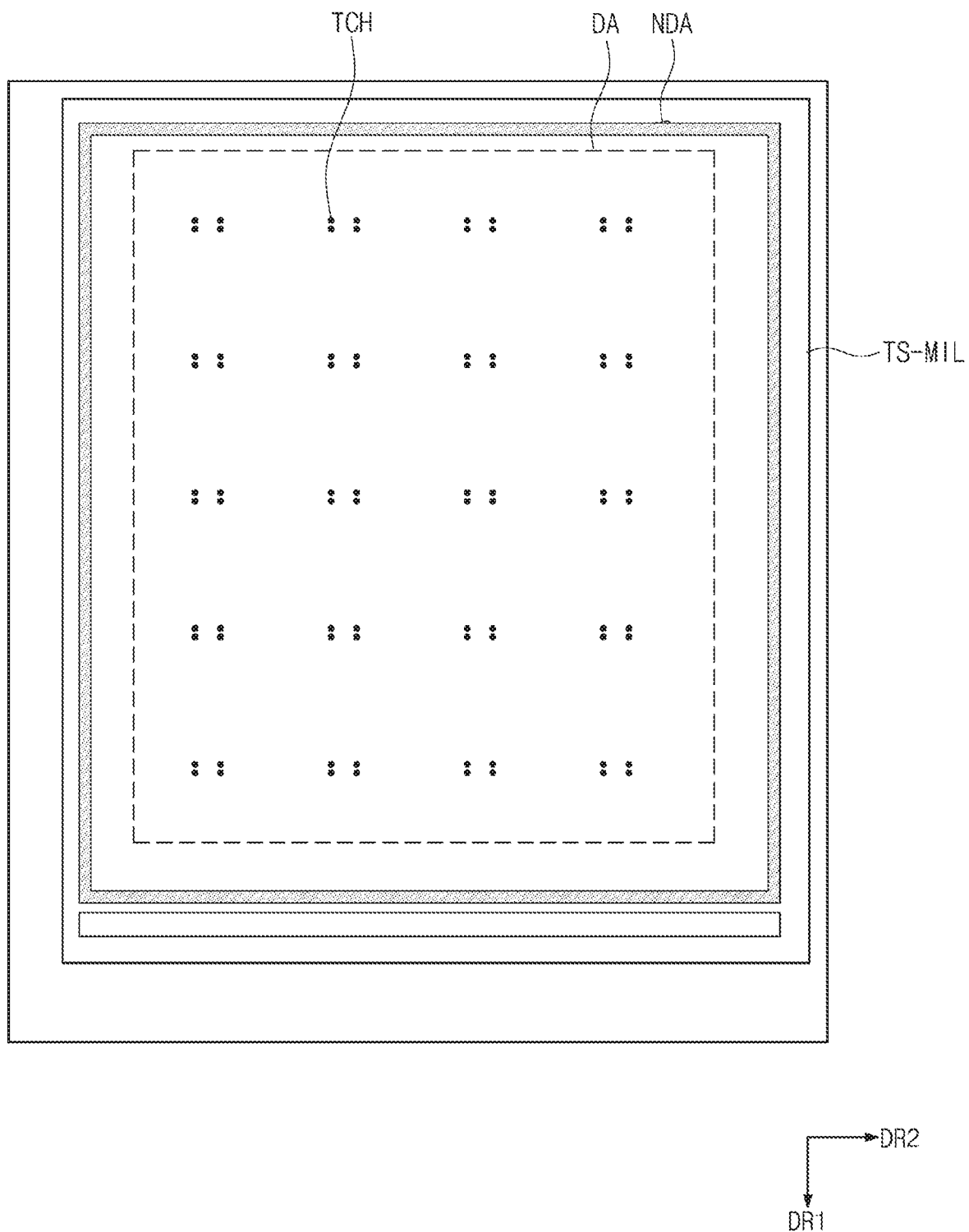

Referring to FIG. 8D, the intermediate insulating layer TS-MIL may be disposed on the lower insulating layer TS-LIL to cover the bridge patterns CP1. Touch contact holes TCH may be defined through the intermediate insulating layer TS-MIL to partially expose the bridge patterns CP1. The touch contact holes TCH may be formed by a photolithography process.

Figure 8E:
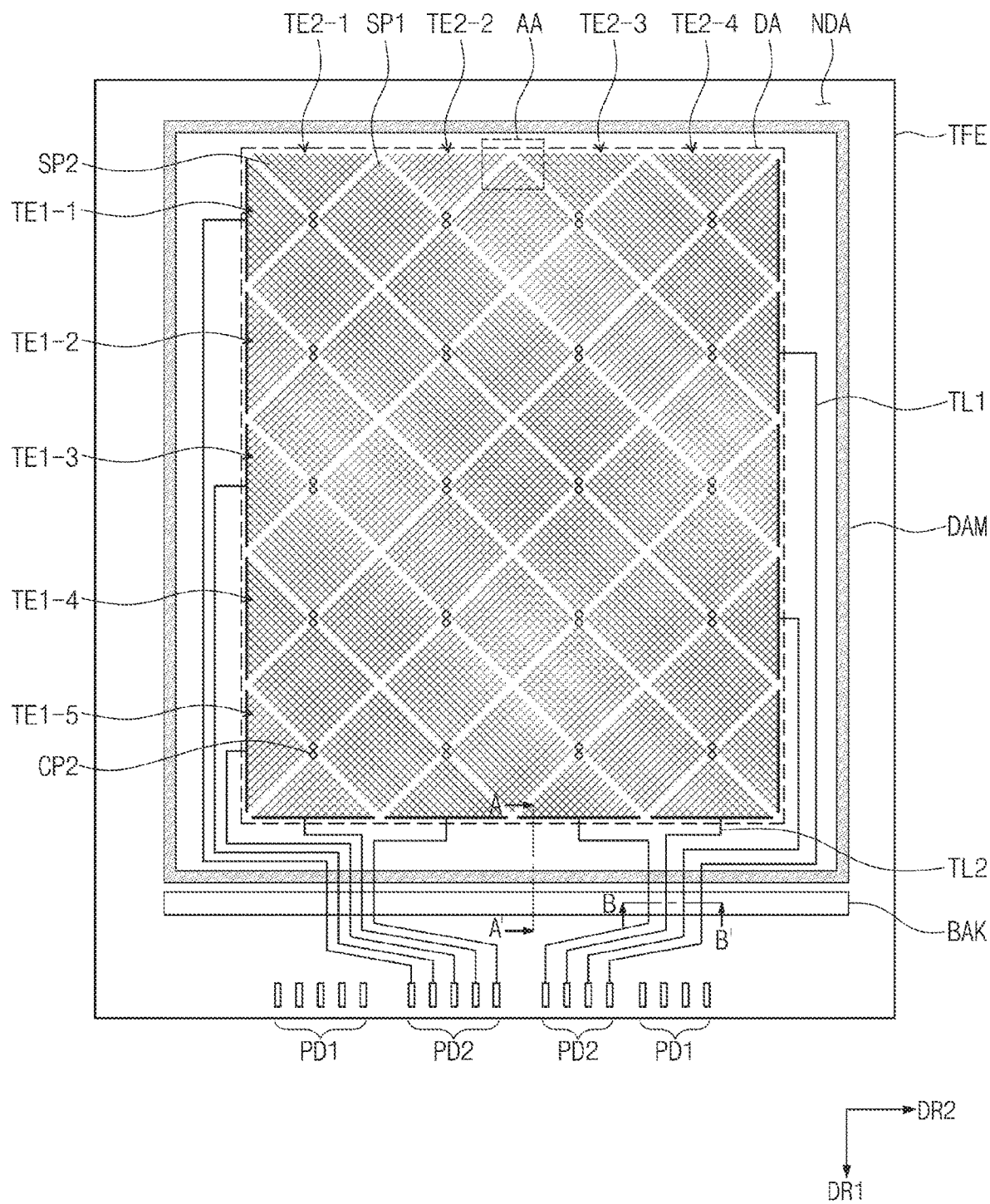

Referring to FIG. 8E, the second conductive patterns may be disposed on the first touch insulating layer TS-IL1. The second conductive patterns may include the first touch sensor parts SP1, the first connection parts CP1, the first touch signal lines TL1, the second touch sensor parts SP2, and the second touch signal lines TL2. The upper insulating layer TS-HIL may be disposed on the intermediate insulating layer TS-MIL to cover the second conductive patterns.

The first conductive patterns may include first touch electrodes TE1-1 and first touch signal lines TL1. The second conductive patterns include second touch electrodes TE2-1 to TE2-4 and second touch signal lines TL2. In this case, the contact holes CH might not be defined in the first touch insulating layer TS-IL1.

In addition, the first conductive patterns and the second conductive patterns may be changed with respect to each other. For example, the second conductive patterns may include the bridge patterns CP1.

Referring to FIG. 8F, the first touch sensor part SP1 may be overlapped with the non-light emitting area NPXA. The first touch sensor part SP1 may include a plurality of first extension parts SP1-A extending in a fifth direction DR5 crossing the first and second directions DR1 and DR2 and a plurality of second extension parts SP1-B extending in a sixth direction DR6 crossing the fifth direction DR5. The first extension parts SP1-A and the second extension parts SP1-B may be defined as mesh lines. Each mesh line may have a line width of a few micrometers.

The first extension parts SP1-A may be connected to the second extension parts SP1-B to define a plurality of touch openings TS-OP. In other words, the first touch sensor part SP1 may have a mesh shape defined by the touch openings TS-OP. The touch openings TS-OP correspond to the light emitting areas PXA, but they should not be limited thereto or thereby. That is, one touch opening TS-OP may correspond to two or more light emitting areas PXA.

The light emitting areas PXA may have various sizes. For instance, among the light emitting areas PXA, the size of the light emitting areas PXA emitting a blue light may be different from the size of the light emitting areas PXA emitting a red light. Accordingly, the touch openings TS-OP may have various sizes. In FIG. 8F, the light emitting areas PXA have various sizes, but the light emitting areas PXA may have the same size as each other, and the touch openings OP may have the same size as each other.

The descriptions of the first touch sensor part SP1 may be applied to the second touch sensor part SP2, and thus detailed descriptions of the second touch sensor part SP2 will be omitted.

Hereinafter, a dam DAM and a bank BAK will be described with reference to FIGS. 8B and 8E.

Referring to FIGS. 8B and 8E, the dam DAM may be disposed in the non-display area NDA (hereinafter, referred to as a "peripheral area") of the base layer SUB (hereinafter, referred to as a "substrate"). In more detail, the dam DAM may have a closed loop shape when viewed in a plan view and surround the display areas. However, the shape of the dam DAM should not be limited to the closed loop shape. In other embodiments, the dam DAM may be provided in a plural number. The plural dams may be arranged in the peripheral area NDA spaced apart from each other and surround the display area.

The bank BAK may be disposed in the peripheral area NDA of the base layer SUB adjacent to the dam DAM. The bank BAK may be disposed between the display area DA and the first pad PD1 and the second pad PD2. The bank BAK may be disposed between the second pad PD2 and the dam DAM. In more detail, the bank BAK may have a bar shape, that is, an elongated rectangular shape, when viewed in a plan view, but the shape of the bank BAK should not be limited to the bar shape.

The first touch signal lines TL1 and the second touch signal lines TL2 extend to be disposed on the dam DAM and the bank BAK and to be connected to the second pad PD2. The dam DAM and the bank BAK will be described in detail with reference to FIGS. 9 to 11.

Figure 9:
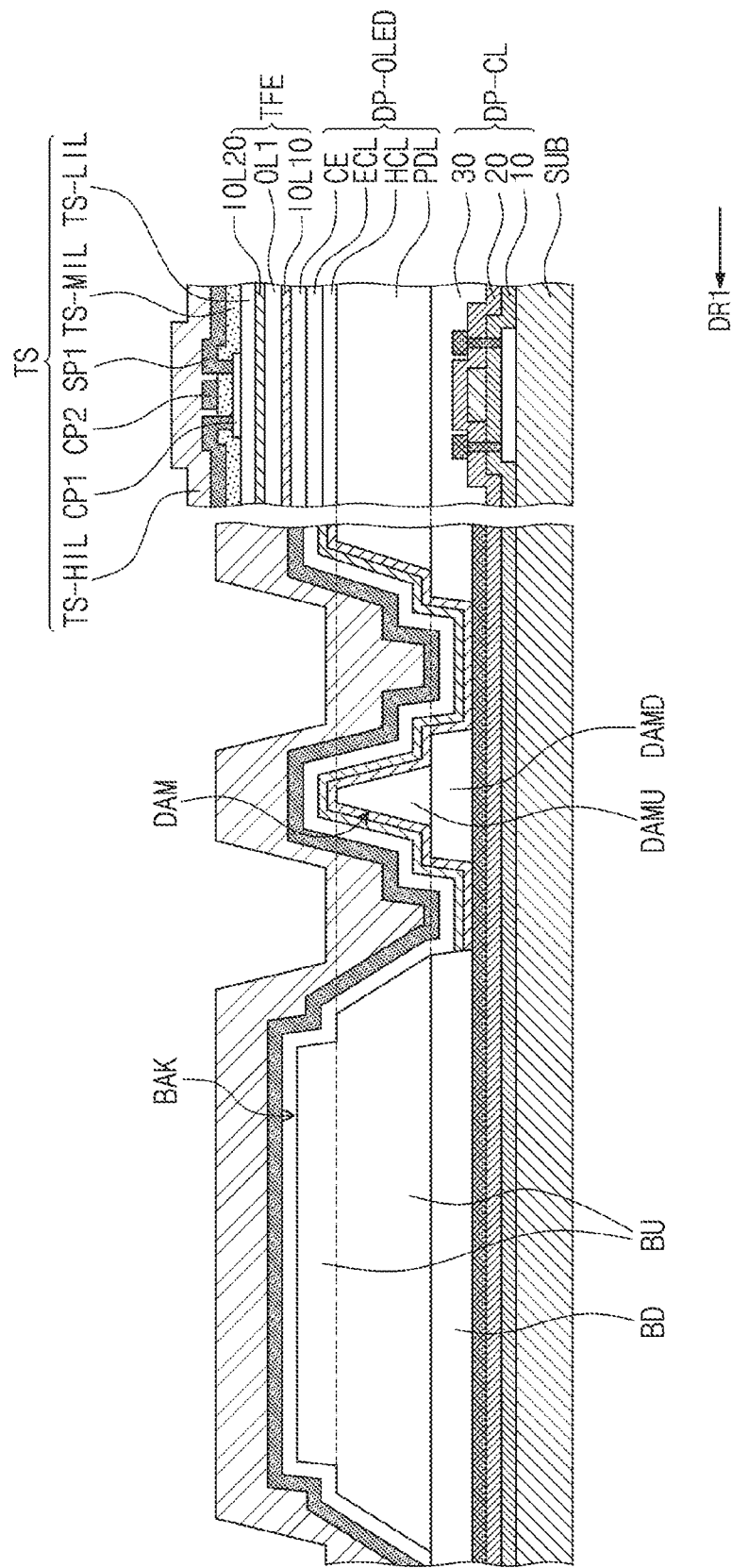
FIG. 9 is a broken, cross-sectional side view taken along line A-A' of FIG. 8E.
Figure 10A:
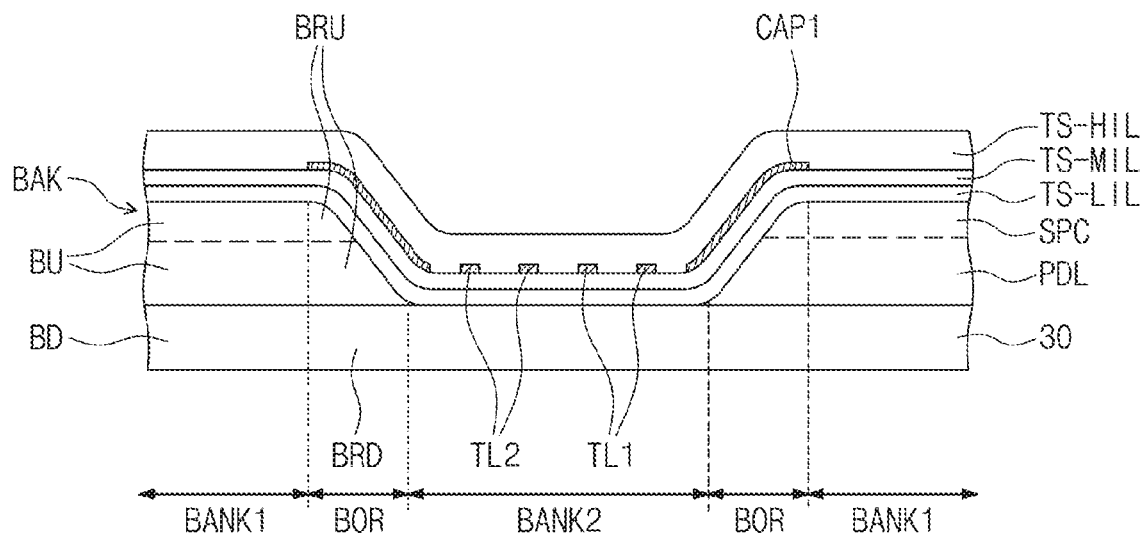
FIG. 10A is a cross-sectional side view taken along line B-B' of FIG. 8E showing a first embodiment of a bank that may be employed in display devices of the invention.
Figure 10B:
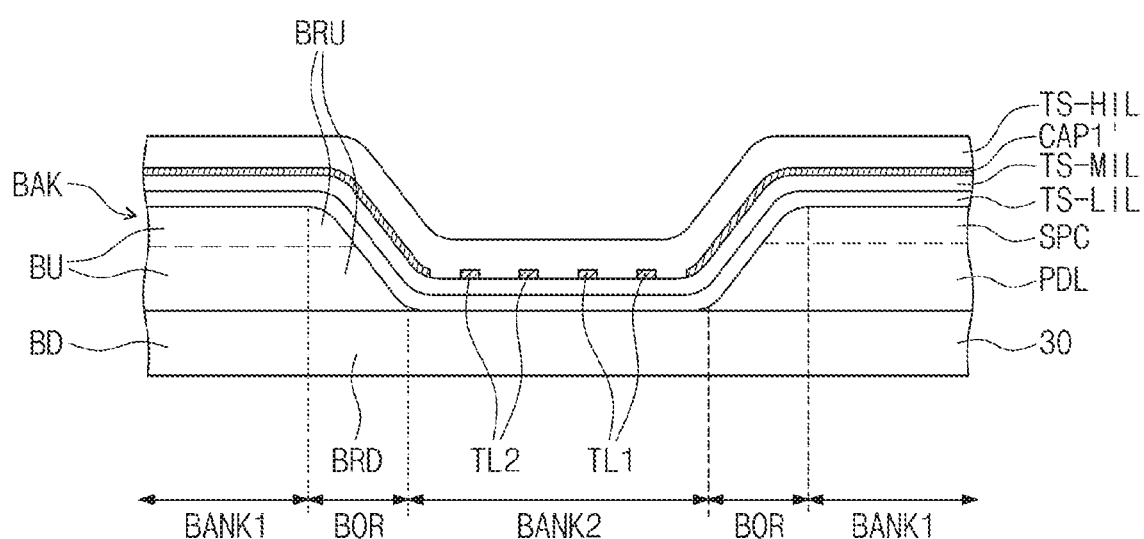
FIG. 10B is a cross-sectional side view showing a second embodiment of a bank that may be employed in display devices of the invention.
Figure 11:
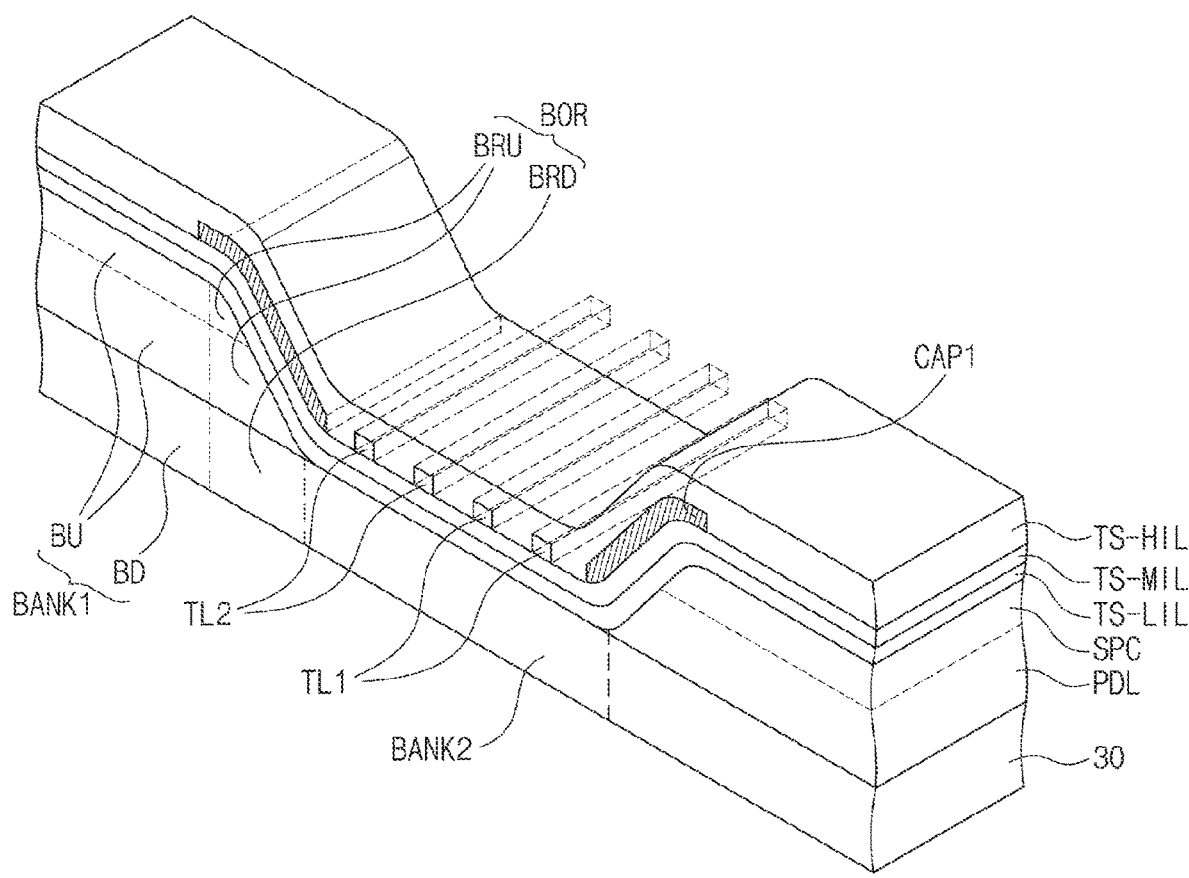
FIG. 11 is a perspective view of the first embodiment of the bank of FIG. 10A.

Referring to FIGS. 9 to 11, the dam DAM may include an upper part DAMU and a lower part DAMD. In more detail, the upper part DAMU may be disposed to contact an upper surface of the lower part DAMD. The lower part DAMD may be formed through the same process as the third insulating layer 30 (refer to FIG. 6A). That is, the lower part DAMD may be disposed on the same layer as the third insulating layer 30. The lower part DAMD may be an organic layer and/or an inorganic layer. Particularly, the lower part DAMD may include an organic material to provide a flat surface.

The upper part DAMU may be formed through the same process as the pixel definition layer PDL. That is, the upper part DAMU may be disposed on the same layer as the pixel definition layer PDL. The upper part DAMU may include an organic material. For instance, the upper part DAMU may include the organic material such as polyimide.

The dam DAM may form an upwardly, extending protrusion by combining the lower part DAMD and the upper part DAMU when viewed in a cross section. The dam DAM may control a flow of an organic thin film material in a thin film encapsulation layer TFE. For instance, in the case that the thin film encapsulation layer TFE shown in FIG. 9 is the thin film encapsulation layer TFE3 shown in FIG. 7C, the dam DAM may control a flow of monomers of the first organic thin layer OL1, and the movement of the first organic thin layer OL1 in the first direction DR1 may be controlled by the dam DAM. Accordingly, the first inorganic thin layer IOL10 of the thin film encapsulation layer TFE may be directly disposed on the dam DAM, and the second inorganic thin layer IOL20 may be directly disposed on the first inorganic thin layer IOL10.

The bank BAK may be spaced apart from the dam DAM in the first direction DR1 by a predetermined distance. The bank BAK may include a first bank part BANK1, a boundary part BOR, and a second bank part BANK2. The boundary part BOR may be disposed between the first bank part BANK1 and the second bank part BANK2.

The first bank part BANK1 may include an upper part BU and a lower part BD. The upper part BU may be disposed on the lower part BD. In more detail, the upper part BU may contact an upper surface of the lower part BD. The lower part BD may be formed through the same process as the third insulating layer 30 (refer to FIG. 6A). That is, the lower part BD may be disposed on the same layer as the third insulating layer 30. The lower part BD may be an organic layer and/or an inorganic layer. Particularly, the lower part BD may include an organic material to provide a flat surface.

The upper part BU may be formed through the same process as the pixel definition layer PDL. That is, the upper part BU may be disposed on the same layer as the pixel definition layer PDL. The upper part BU may include a part corresponding to the pixel definition layer PDL and a spacer SPC. The spacer SPC may be substantially simultaneously formed with the part corresponding to the pixel definition layer PDL. The spacer SPC may be disposed on the pixel definition layer PDL. The first bank BANK1 may have a height greater than that of the dam DAM. The upper part BU may include an organic material such as a polyimide.

The boundary part BOR may include an upper part BRU and a lower part BRD as the first bank part BANK1. The other parts of the boundary part BOR may be substantially the same as the first bank part BANK1, and thus detailed descriptions thereof are not necessary and will be omitted.

The second bank part BANK2 may be formed through the same process as the third insulating layer 30. That is, the second bank part BANK2 may be disposed on the same layer as the third insulating layer 30. The second bank part BANK2 may be an organic layer and/or an inorganic layer.

The boundary part BOR may be provided in a plural number. The second bank part BANK2 may be disposed between two boundary parts BOR adjacent to each other. The second bank part BANK2 may have a height smaller than that of the first bank part BANK1 and the boundary part BOR.

Consequently, the lower part BD of the first bank part BANK1, the lower part BRD of the boundary part BOR, and the second bank part BANK 2 may be integrally formed with each other.

As described above, when the second bank part BANK2 and the boundary part BOR are formed, the bank BAK may prevent the abnormal patterning of the touch signal lines, which occurs on the upper surface of the bank BAK by getting cuts or scratches due to a mask used to form the thin film encapsulation layer TFE in a process supporting the mask.

Figure 12A:
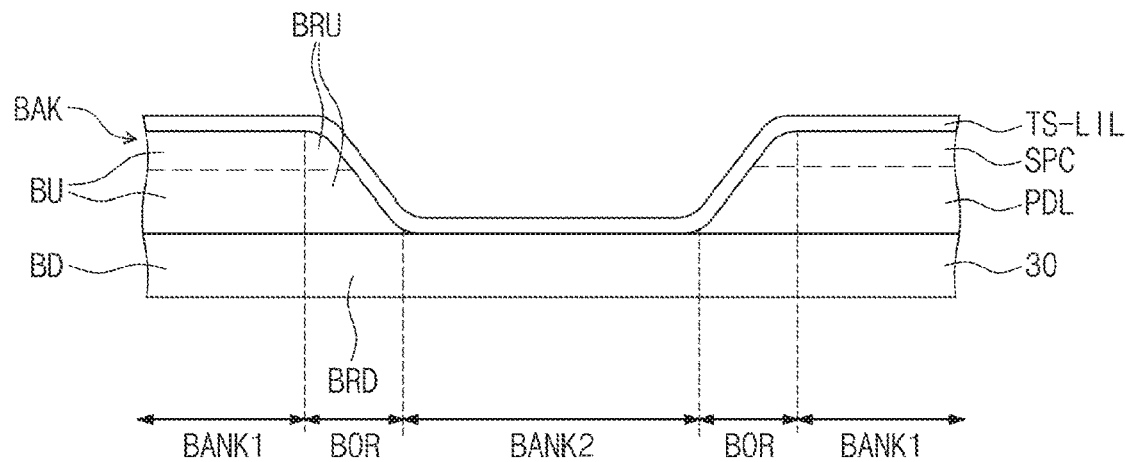
FIGS. 12A to 12G are cross-sectional side views showing an exemplary process of forming a bank with a first capping pattern of FIG. 10A and FIG. 11.

Referring to FIG. 12A, the lower insulating layer TS-LIL may be formed on the bank BAK. The lower insulating layer TS-LIL may be formed on the bank BAK through a deposition process.

Figure 12B:
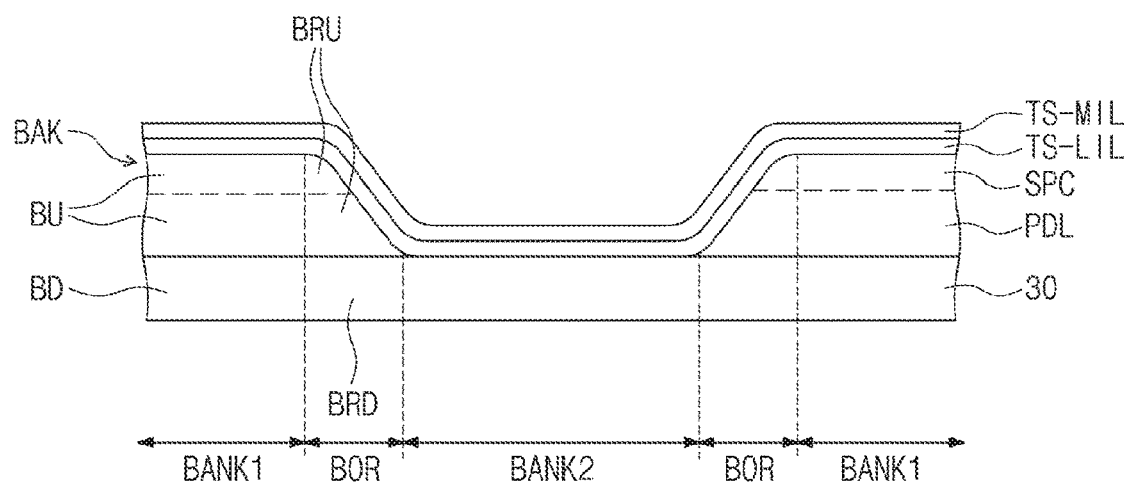

Referring to FIG. 12B, the intermediate insulating layer TS-MIL may be formed on the lower insulating layer TS-LIL through a deposition process.

Figure 12C:
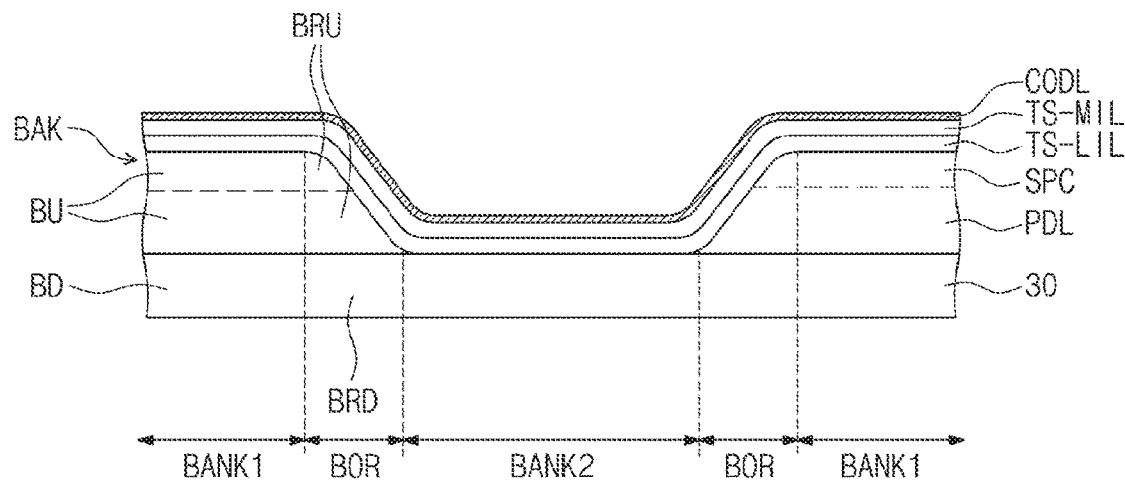

Referring to FIG. 12C, a conductive layer CODL, which may be formed as the first capping pattern CAP1 and the touch signal lines TL1 and TL2, may be formed on the intermediate insulating layer TS-MIL. The conductive layer CODL may be formed on the intermediate insulating layer TS-MIL by a deposition process. The conductive layer CODL may include indium tin oxide (ITO), indium zinc oxide (IZO), zinc oxide (ZnO), indium tin zinc oxide (ITZO), PEDOT, a metal nano-wire, and a graphene. The touch sensors and the touch signal lines may include a metal layer, e.g., molybdenum, silver, titanium, copper, aluminum, or an alloy thereof.

Figure 12D:
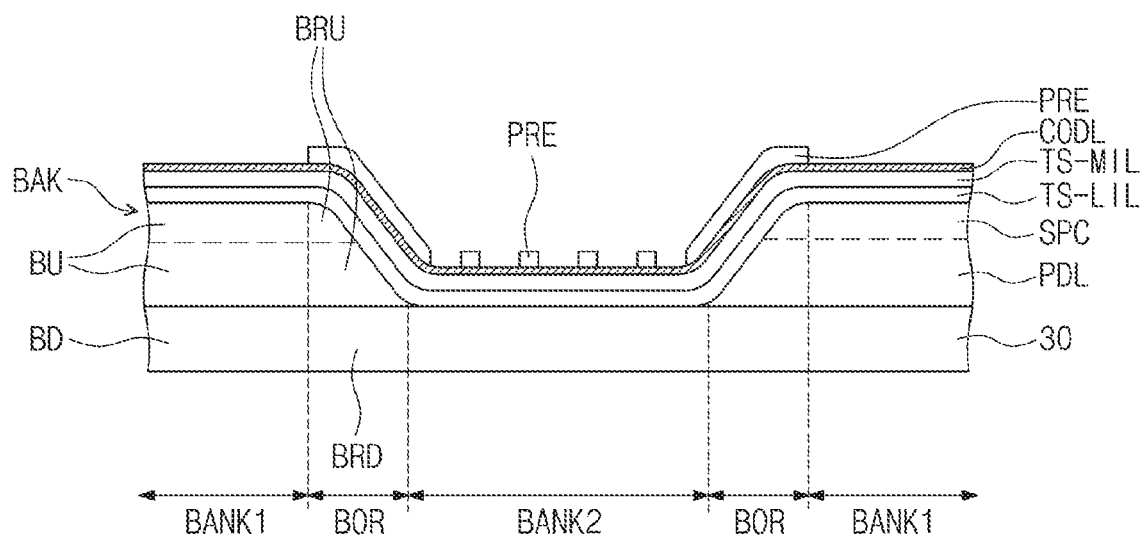

Referring to FIG. 12D, a photoresist layer PRE may be formed on the conductive layer CODL, and a portion of the photoresist layer PRE may be exposed to a light except for portions in which the first capping pattern CAP1 and the touch signal lines TL1 and TL2 may be formed.

Figure 12E:
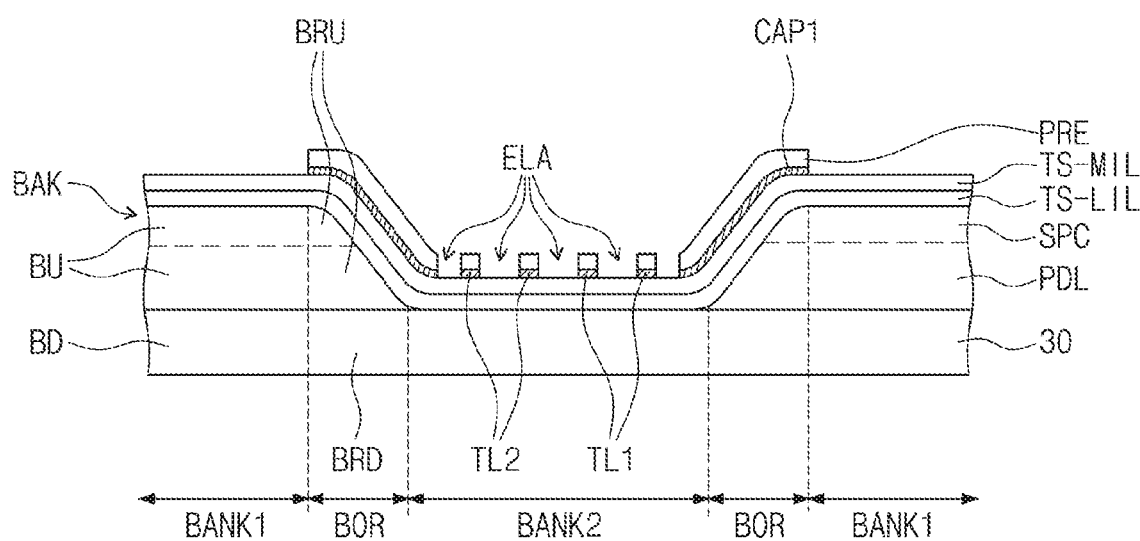

Referring to FIG. 12E, an etching process may be performed on the conductive layer CODL corresponding to the light-exposed portion ELA. For instance, the conductive layer CODL corresponding to the light-exposed portion ELA may be etched by a dry etching process.

Figure 12F:
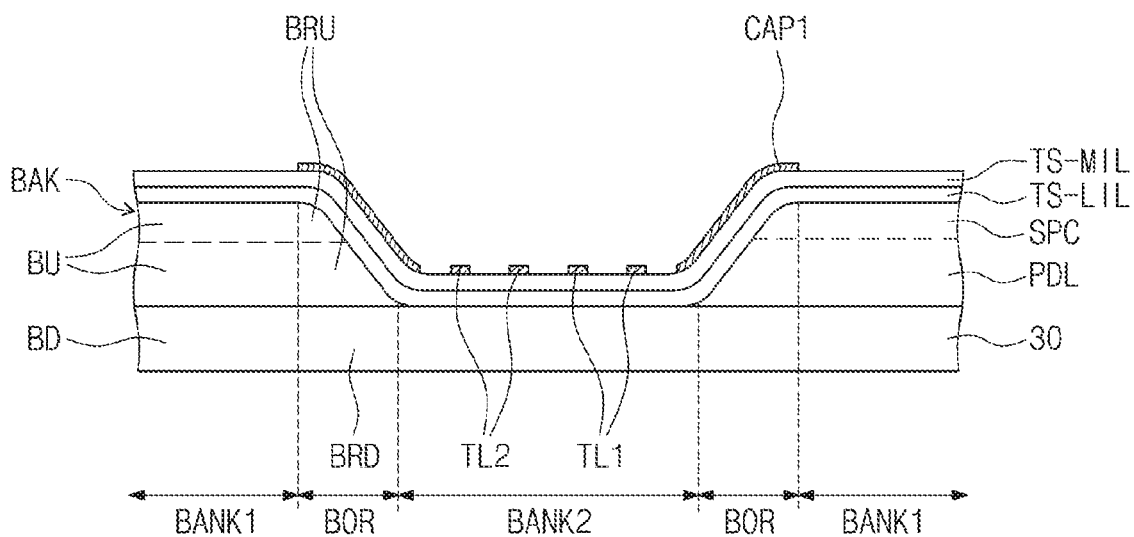

Referring to FIG. 12F, after the etching process is performed, the photoresist layer PRE may be removed by a strip process. When the photoresist layer PRE is removed, the upper insulating layer TS-HIL may be formed on the intermediate insulating layer TS-MIL, such that the first capping pattern CAP1 may be formed between the intermediate insulating layer TS-MIL and the upper insulating layer TS-HIL to correspond to the boundary part BOR, and the first and second touch signal lines TL1 and TL2 may be formed between the intermediate insulating layer TS-MIL and the upper insulating layer TS-HIL to correspond to the second bank part BANK2.

Figure 12G:
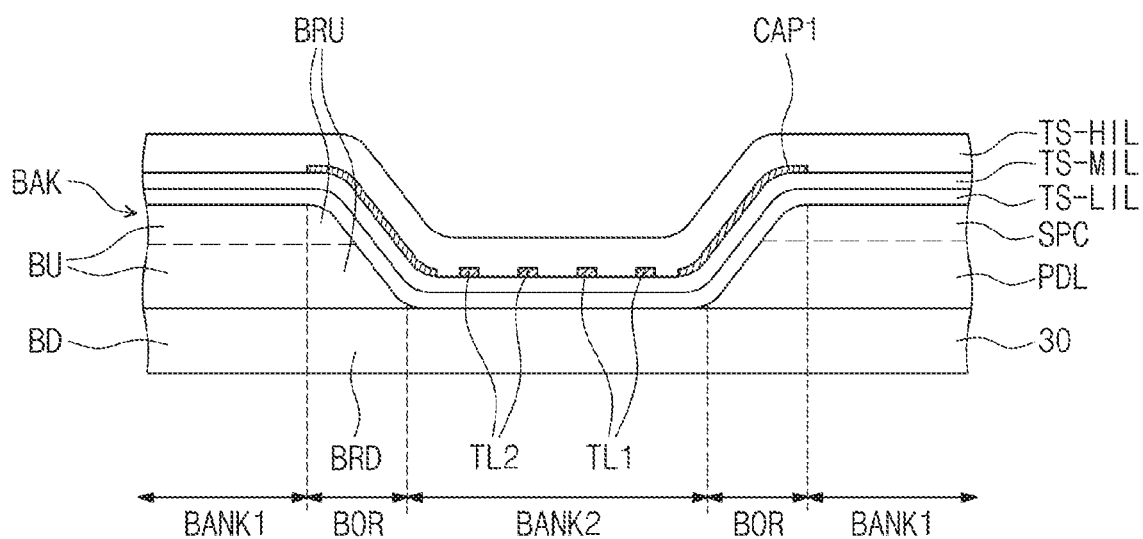

Referring to FIGS. 10A, 11, and 12G, the first capping pattern CAP1 and the first and second touch signal lines TL1 and TL2 may be formed between the intermediate insulating layer TS-MIL and the upper insulating layer TS-HIL to be covered by the upper insulating layer TS-HIL. The upper insulating layer TS-HIL may be formed on the intermediate insulating layer TS-MIL through a deposition process.

Since first capping pattern CAP1 extends along the full extent of boundary part BOR, as shown in FIG. 10A, leakage of the organic material in the bank BAK during the etching process, which is caused by thinning of the photoresist layer on the boundary part, may be prevented from occurring. Consequently, delamination of layers due to leakage of organic material also may be prevented from occurring.

As shown in FIG. 10B, the first capping pattern CAP1' may be formed between the intermediate insulating layer TS-MIL and the upper insulating layer TS-HIL to extend along the full extent of the first bank part BANK1 and the boundary part BOR. The first capping pattern CAP1, CAP1' may take other forms as well. For example, the touch signal lines TL1 and TL2 and the first capping pattern CAP1, CAP1' may be formed on the intermediate insulating layer TS-MIL; and, the touch signal lines TL1 and TL2 may be formed on the lower insulating layer TS-LIL as described above. Thus, the first capping pattern CAP1, CAP1' may be formed between the lower insulating layer TS-LIL and the intermediate insulating layer TS-MIL.

Figure 13A:
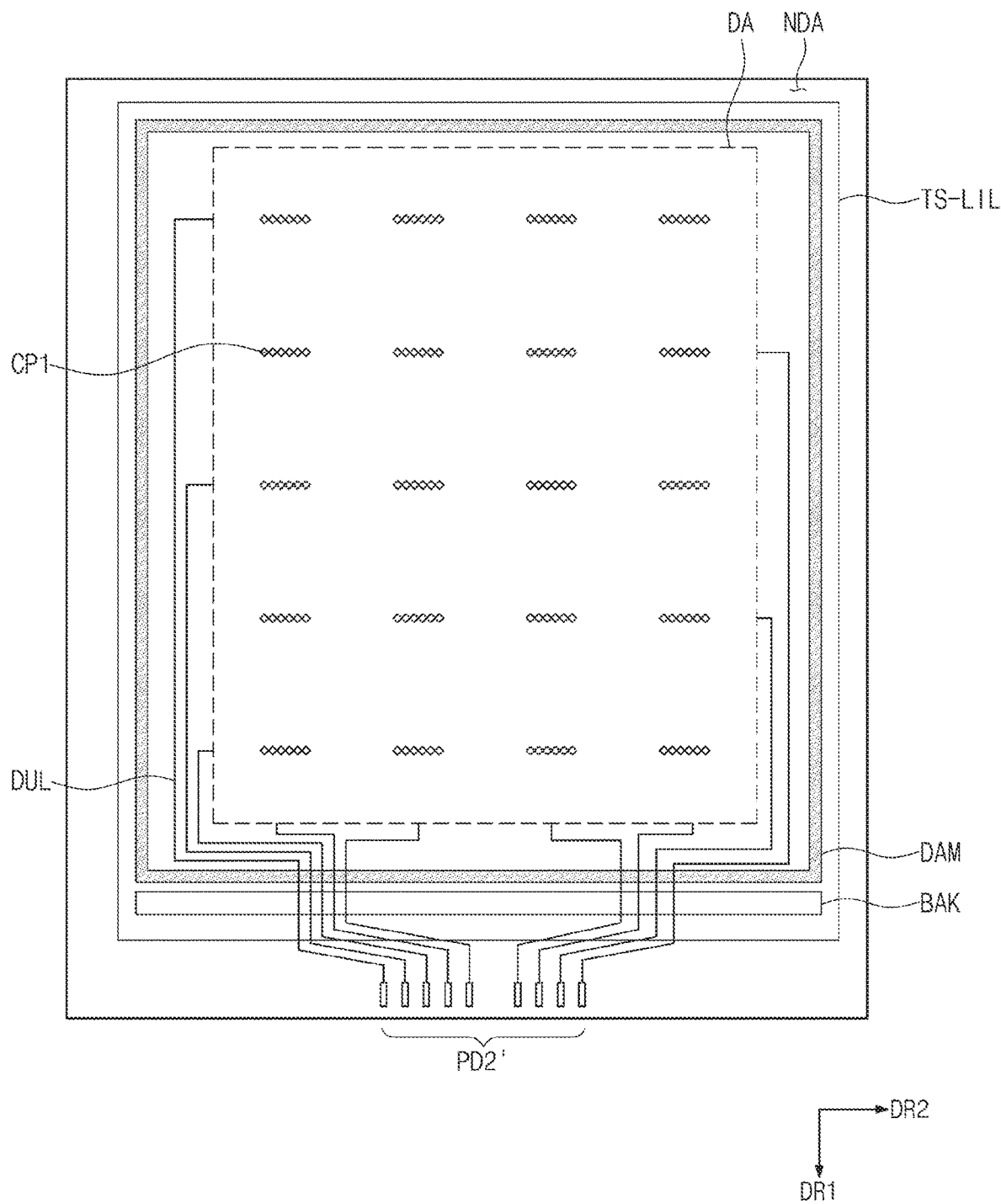
FIGS. 13A to 13C are partially top sectional views of various layers of another exemplary embodiment of a touch sensing unit that may be employed in display devices of the invention.

Referring to FIG. 13A, dummy lines DUL may be disposed on a lower insulating layer TS-LIL. The dummy lines DUL may overlap the touch signal lines TL1 and TL2 shown in FIG. 14. The dummy lines DUL may be connected to the touch signal lines TL1 and TL2 in parallel to reduce a resistance of lines through which signals may be transmitted, thereby improving the sensitivity of the device in sensing touch.

A method of forming the dummy lines DUL may be substantially the same as that of the touch signal lines TL1 and TL2, and thus details thereof will therefore be omitted.

Figure 13B:
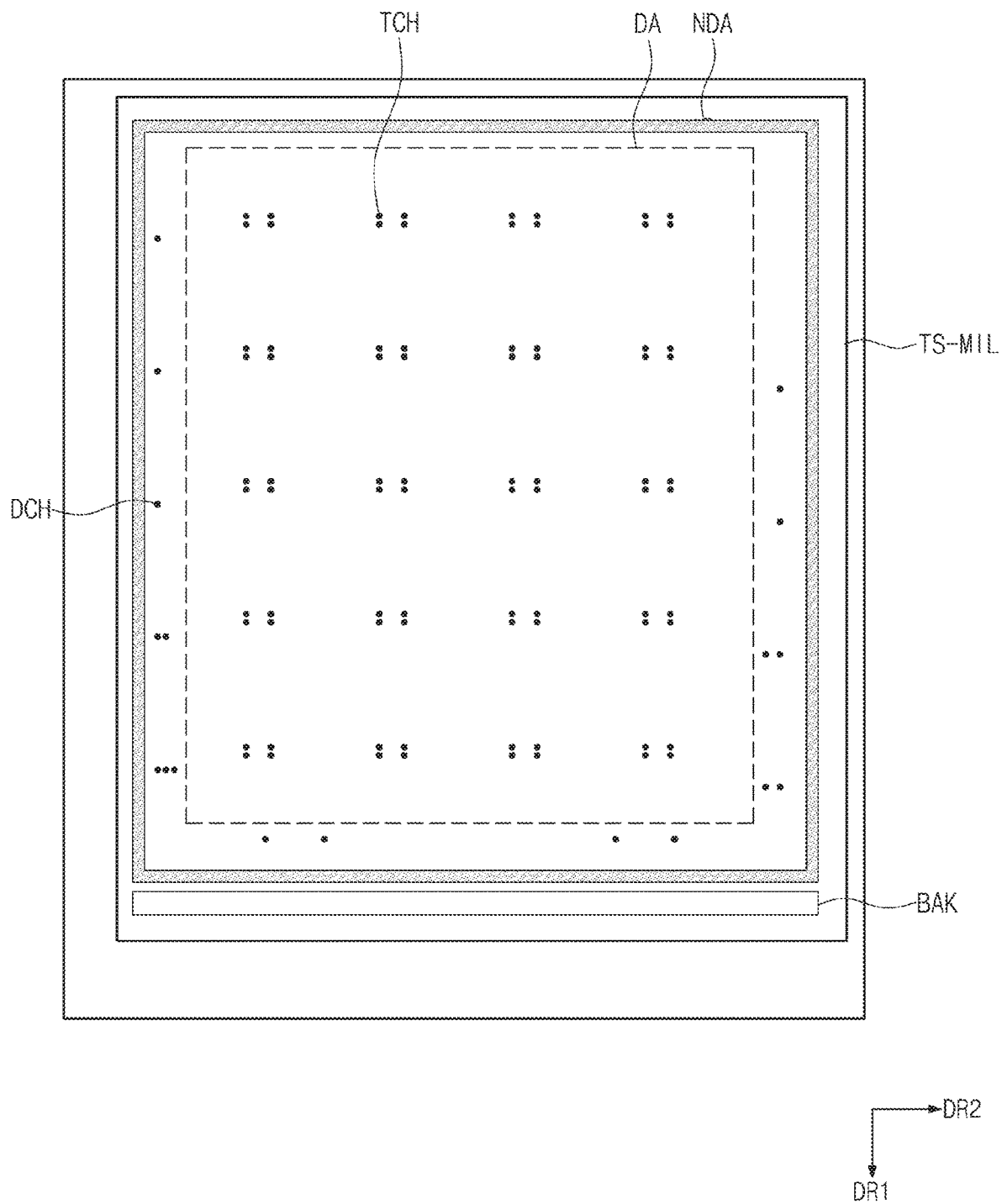

Referring to FIG. 13B, dummy contact holes DCH may be defined through the intermediate insulating layer TS-MIL to partially expose the touch signal lines TL1 and TL2. The dummy contact holes DCH may be formed by a photolithography process. The dummy lines DUL shown in FIG. 13A may be connected to the touch signal lines TL1 and TL2 through the dummy contact holes DCH.

Figure 13C:
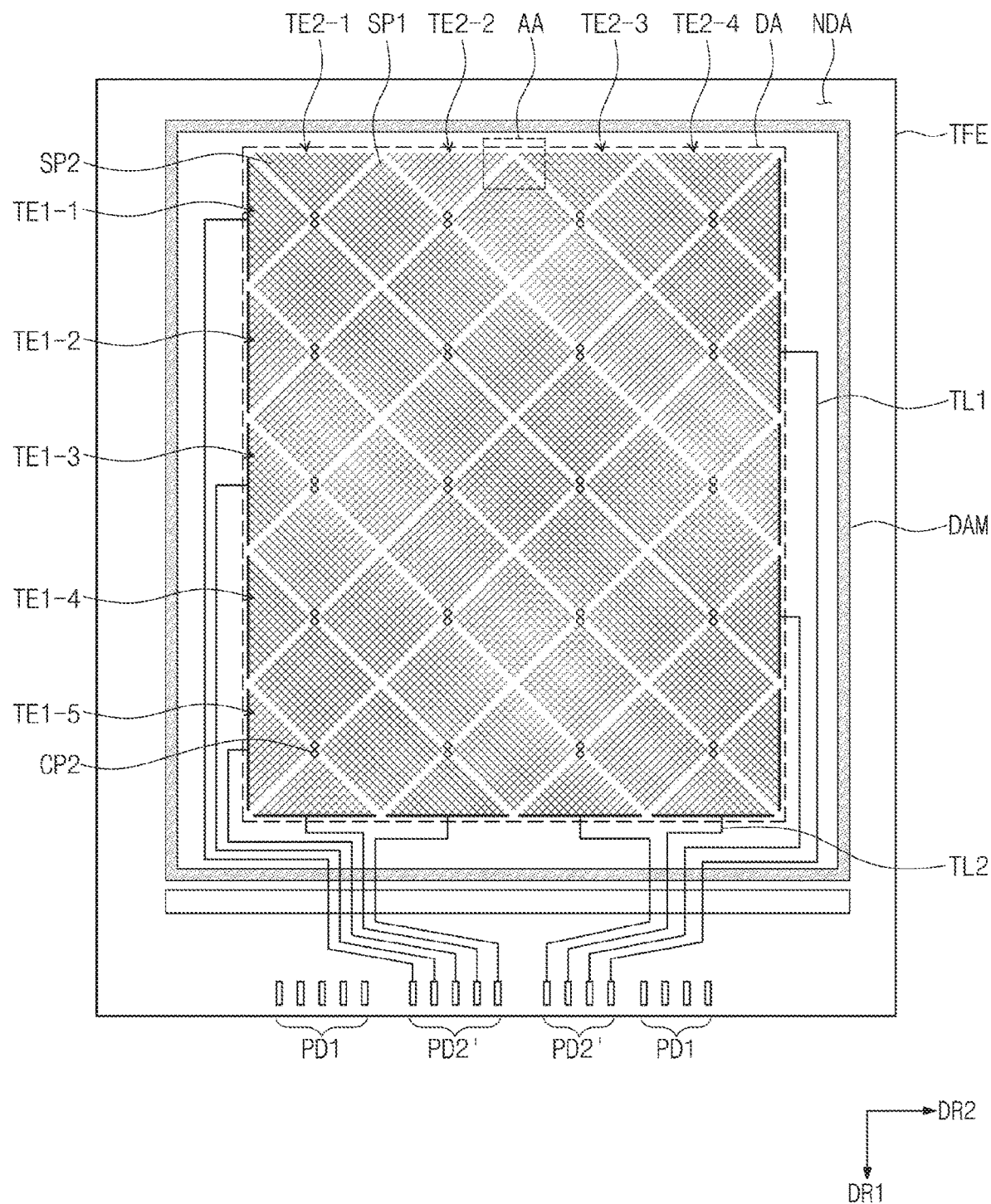

Referring to FIG. 13C, because the dummy lines DUL may overlap the touch signal lines TL1 and TL2, the dummy lines DUL might not be visible from above after the first and second touch signal lines TL1 and TL2 are formed. Each of the dummy lines DUL may be connected to a second pad PD2' to which a corresponding touch signal line of the touch signal lines TL1 and TL2 may be connected.

Figure 14:
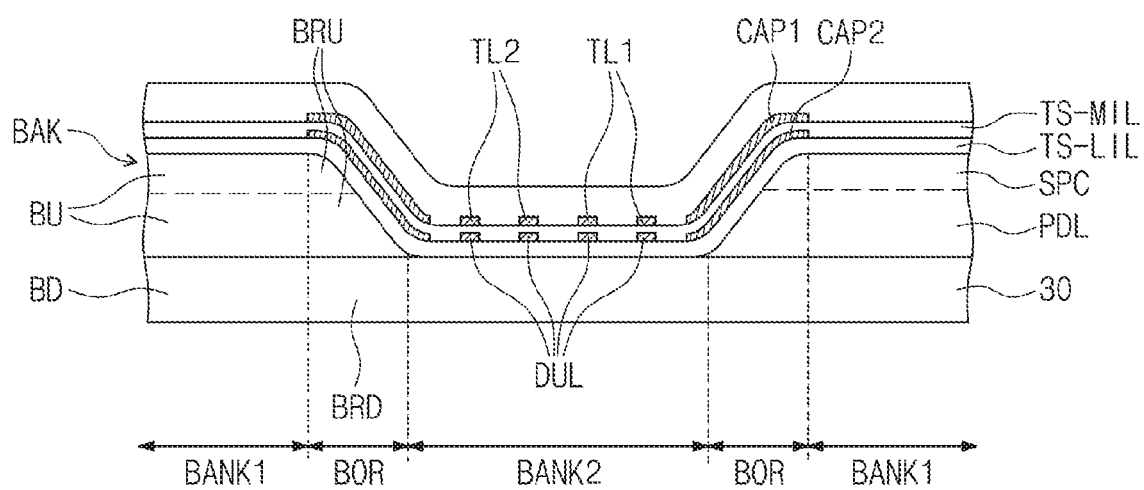
FIG. 14 is a cross-sectional side view of a third embodiment of a bank with first and second capping portions that may be employed in display devices of the invention.

Referring to FIG. 14, a second capping pattern CAP2 may be disposed between the lower insulating layer TS-LIL and the intermediate insulating layer TS-MIL to correspond to the boundary part BOR, and the dummy lines DUL may be disposed between the lower insulating layer TS-LIL and the intermediate insulating layer TS-MIL to correspond to the second bank part BANK2. The second capping pattern CAP2 and the dummy lines DUL may be formed through the same process, and the forming method of the second capping pattern CAP2 and the dummy lines DUL may be substantially the same as the forming of the first capping pattern CAP1 and the touch signal lines TL1 and TL2 as described in greater detail above. Accordingly, a more detailed description of the process of forming the second capping pattern CAP2 and the dummy lines DUL is not necessary and will be omitted.

Consistent with the description of the first capping pattern CAP1, CAP 1' above, the forming of the second capping pattern CAP2 reduces the likelihood, or completely prevents, defects, such as the phenomenon in which layers become delaminated.

The dummy lines DUL may be disposed on the lower insulating layer TS-LIL and the intermediate insulating layer TS-MIL, but they should not be limited thereto or thereby. For instance, the touch signal lines TL1 and TL2 may be disposed on the lower insulating layer TS-LIL and the intermediate insulating layer TS-MIL, and the dummy lines DUL may be disposed between the intermediate insulating layer TS-MIL and the upper insulating layer TS-HIL.

Although certain exemplary embodiments and implementations have been described herein, other embodiments and modifications will be apparent from this description. Accordingly, the inventive concept is not limited to such embodiments, but rather to the broader scope of the presented claims and various obvious modifications and equivalent arrangements.

What is claimed is:
1. A display device comprising:
   a base layer comprising a first area and a second area;
   a plurality of light emitting elements disposed on the first area of the base layer;
   an encapsulation layer sealing the plurality of light emitting elements;
   a plurality of sensors disposed on the encapsulation layer;

a plurality of pads disposed on the second area of the base layer and arranged in a first direction;

a plurality of signal lines electrically connected to the plurality of sensors and the plurality of pads, respectively; and a sub layer disposed on the second area of the base layer, wherein the sub layer is disposed between the plurality of sensors and the plurality of pads and extends in the first direction, wherein:

the sub layer comprises:

a first layer; and a second layer disposed on the first layer; and the second layer does not overlap with the plurality of signal lines when viewed in a plan view.

2. The display device of claim 1, wherein a portion of the second layer is removed, and the plurality of signal lines are disposed on the portion of the second layer.

3. The display device of claim 1, wherein the plurality of signal lines extends in a second direction intersecting with the first direction.

4. The display device of claim 1, wherein each of the plurality of sensors is electrostatically coupled to adjacent sensors.

5. The display device of claim 1, wherein the plurality of sensors obtains coordinate information using a mutual-capacitance method or a self-capacitance method.

6. The display device of claim 1, further comprising a first capping pattern disposed on the second layer of the sub layer.

7. The display device of claim 6, further comprising a first insulating layer covering the plurality of sensors, the plurality of signal lines, the sub layer, and the first capping pattern.

8. The display device of claim 6, further comprising:

a plurality of dummy lines overlapping the plurality of signal lines; and a second capping pattern overlapping the first capping pattern.

9. The display device of claim 8, wherein:

the plurality of dummy lines are disposed below the plurality of signal lines, respectively; and the second capping pattern is disposed below the first capping pattern.

10. The display device of claim 9, further comprising a second insulating layer disposed between the plurality of dummy lines and the plurality of signal lines and between the second capping pattern and the first capping pattern.

11. The display device of claim 1, further comprising a protruding part disposed on the second area of the base layer and surrounding the plurality of sensors, wherein at least a portion of the protruding part is disposed between the sub layer and the plurality of sensors.

12. A display device comprising:

a substrate comprising a first area and a second area defined outside the first area;

an element layer comprising a plurality of light emitting elements, and disposed on the first area of the substrate;

an encapsulation layer covering the element layer;

an input sensing unit comprising an insulating layer disposed on the encapsulation layer, a plurality of electrodes disposed on the encapsulation layer, and a plurality of signal lines connected to the plurality of electrodes, respectively;

a sub layer disposed on the second area and the sub layer comprising a first portion having a first thickness and a second portion having a second thickness smaller than the first thickness and overlapping the plurality of signal lines; and a capping pattern disposed on a boundary portion between the first portion and the second portion, wherein the plurality of signal lines and the capping pattern are covered by the insulating layer.

13. A display device comprising:

a base layer comprising a first area and a second area defined outside the first area;

an element layer comprising a plurality of light emitting elements disposed on the first area of the base layer;

an encapsulation layer covering the element layer;

an input sensing unit comprising an insulating layer disposed on the encapsulation layer, a plurality of electrodes disposed on the encapsulation layer, and a plurality of signal lines electrically connected to the plurality of electrodes, respectively; and a sub layer disposed on the second area and the sub layer comprising a first portion having a first thickness and a second portion having a second thickness smaller than the first thickness and overlapping the plurality of signal lines, wherein the plurality of signal lines extend in a first direction and the sub layer extends in a second direction intersecting with the first direction.

* * * * *